(12) United States Patent
Ihara

(10) Patent No.: US 8,179,692 B2
(45) Date of Patent: May 15, 2012

(54) BOARD HAVING CONNECTION TERMINAL

(75) Inventor: Yoshihiro Ihara, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 131 days.

(21) Appl. No.: 12/824,456

(22) Filed: Jun. 28, 2010

(65) Prior Publication Data

US 2011/0003492 A1   Jan. 6, 2011

(30) Foreign Application Priority Data

Jul. 3, 2009 (JP) ................. 2009-158994

(51) Int. Cl.
*H05K 3/00* (2006.01)
*H01R 12/00* (2006.01)

(52) U.S. Cl. ........ 361/787; 361/760; 361/761; 361/769; 439/66; 439/81; 438/117; 438/611; 29/874; 29/884; 257/735; 257/696; 257/750; 257/773

(58) Field of Classification Search .......... 361/760–767, 361/783–798; 174/250–267; 257/677, 669, 257/686, 698, 734, 737, E23.078, 761, 764; 324/754, 756, 754.03, 755.06, 756.03; 29/825–852, 29/874, 884, 882, 877; 439/55, 65, 66, 78, 439/81, 83, 7, 1, 76.2, 75, 949, 862, 125, 439/751

See application file for complete search history.

(56) References Cited

U.S. PATENT DOCUMENTS

| | | | | |
|---|---|---|---|---|
| 3,842,189 A * | 10/1974 | Southgate | ............ | 174/547 |
| 4,553,192 A * | 11/1985 | Babuka et al. | ......... | 361/743 |
| 4,677,458 A * | 6/1987 | Morris | ............ | 257/696 |
| 5,612,520 A * | 3/1997 | Toedtman et al. | .......... | 200/16 D |
| 5,763,941 A * | 6/1998 | Fjelstad | ............ | 257/669 |
| 6,117,694 A * | 9/2000 | Smith et al. | ............ | 438/14 |
| 6,302,702 B1 | 10/2001 | Audet et al. | | |
| 6,475,822 B2 * | 11/2002 | Eldridge et al. | ............ | 438/52 |
| 6,528,350 B2 * | 3/2003 | Fork | ............ | 438/117 |
| 6,532,654 B2 * | 3/2003 | Guerin et al. | ............ | 29/884 |
| 6,684,499 B2 * | 2/2004 | Romano et al. | ............ | 29/874 |
| 6,777,319 B2 * | 8/2004 | Grube et al. | ............ | 438/612 |
| 6,807,734 B2 * | 10/2004 | Eldridge et al. | ............ | 29/874 |
| 6,827,584 B2 * | 12/2004 | Mathieu et al. | ............ | 439/66 |
| 6,965,245 B2 * | 11/2005 | Kister et al. | ............ | 324/754.07 |
| 7,015,584 B2 * | 3/2006 | Chow et al. | ............ | 257/773 |
| 7,025,600 B2 * | 4/2006 | Higashi | ............ | 439/66 |
| 7,047,638 B2 * | 5/2006 | Eldridge et al. | ............ | 29/884 |
| 7,057,295 B2 * | 6/2006 | Ju | ............ | 257/784 |
| 7,073,254 B2 * | 7/2006 | Eldridge et al. | ............ | 29/843 |
| 7,137,830 B2 * | 11/2006 | Lahiri et al. | ............ | 439/81 |
| 7,173,441 B2 * | 2/2007 | Kister et al. | ............ | 324/756.03 |

(Continued)

FOREIGN PATENT DOCUMENTS

JP   2000-299422   10/2000

*Primary Examiner* — Michail V Datskovskiy
(74) *Attorney, Agent, or Firm* — IPUSA, PLLC

(57) ABSTRACT

A board includes a board body; a first conductor provided at a first surface of the board body; and an electrically conductive connection terminal having a spring property. The connection terminal includes a first end part fixed to the first conductor; a second end part to be connected to a first object of connection to be placed opposite the first surface of the board body; and a projection part provided on the first end part so as to project toward the first conductor.

17 Claims, 23 Drawing Sheets

U.S. PATENT DOCUMENTS

| | | | |
|---|---|---|---|
| 7,293,996 B2 * | 11/2007 | Van Schuylenbergh et al. | 439/66 |
| 7,371,073 B2 * | 5/2008 | Williams | 439/66 |
| 7,435,108 B1 * | 10/2008 | Eldridge et al. | 439/81 |
| 7,458,816 B1 * | 12/2008 | Mathieu et al. | 439/66 |
| 7,503,811 B2 * | 3/2009 | Seo et al. | 439/751 |
| 7,541,219 B2 * | 6/2009 | Milligan et al. | 438/117 |
| 7,674,112 B2 * | 3/2010 | Gritters et al. | 439/66 |
| 7,714,235 B1 * | 5/2010 | Pedersen et al. | 174/267 |
| 2005/0208834 A1 * | 9/2005 | Kodaira et al. | 439/630 |
| 2006/0166479 A1 * | 7/2006 | Seo et al. | 438/618 |
| 2006/0286832 A1 * | 12/2006 | Van Schuylenbergh et al. | 439/125 |
| 2007/0020960 A1 * | 1/2007 | Williams | 439/66 |
| 2007/0269997 A1 * | 11/2007 | Eldridge et al. | 439/66 |
| 2008/0074132 A1 * | 3/2008 | Fan et al. | 324/762 |
| 2008/0239683 A1 * | 10/2008 | Brodsky et al. | 361/760 |

* cited by examiner

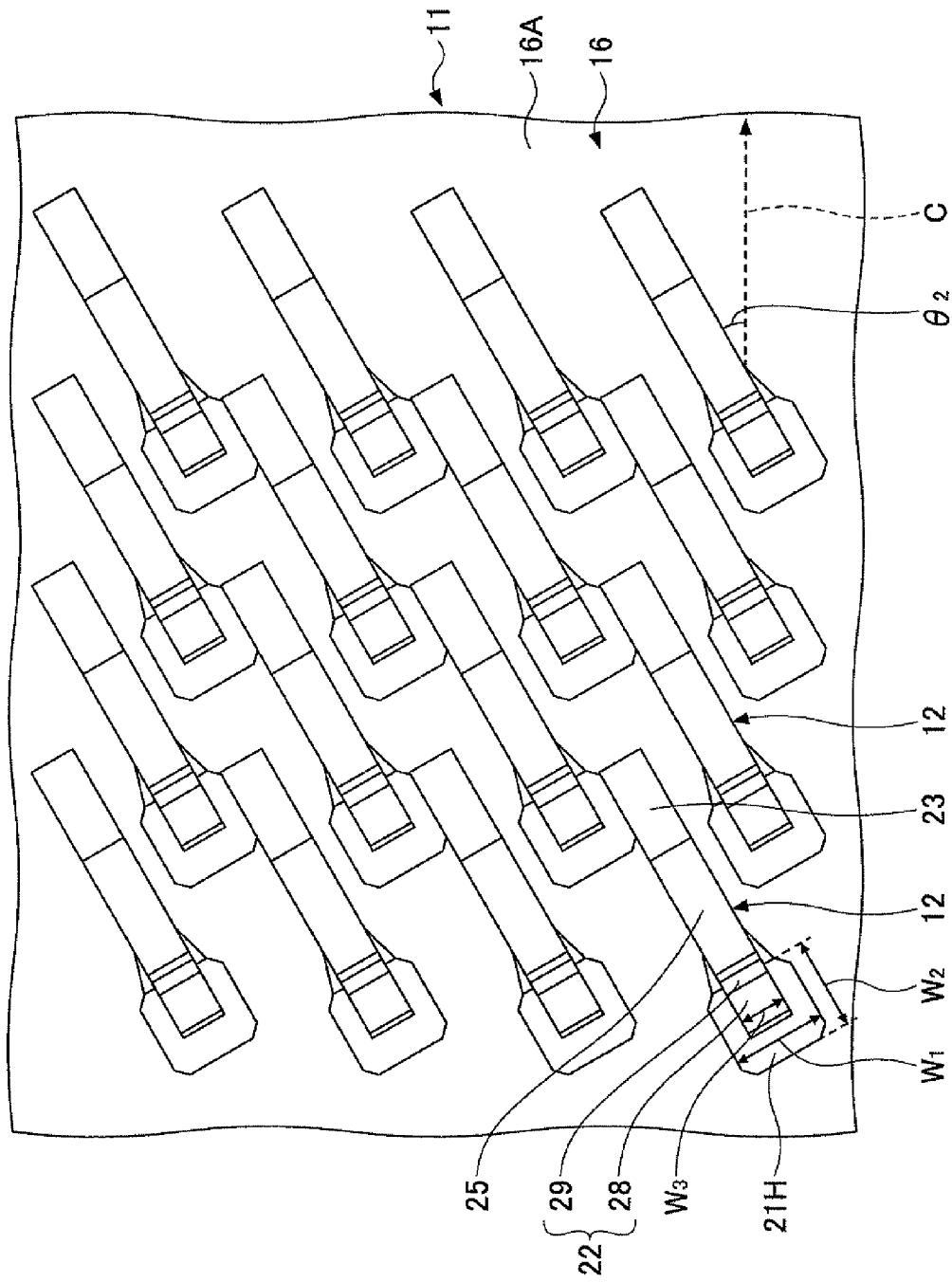

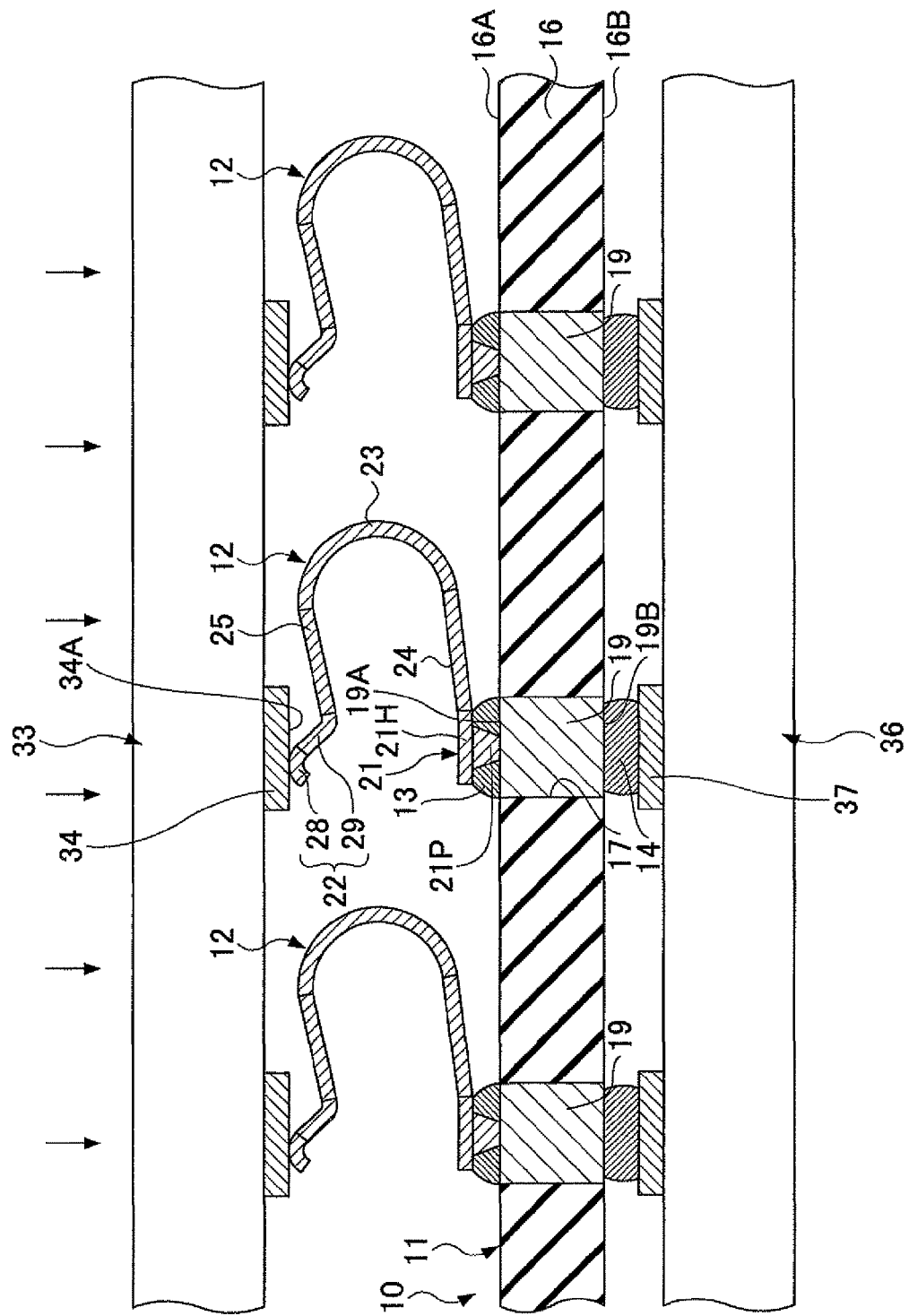

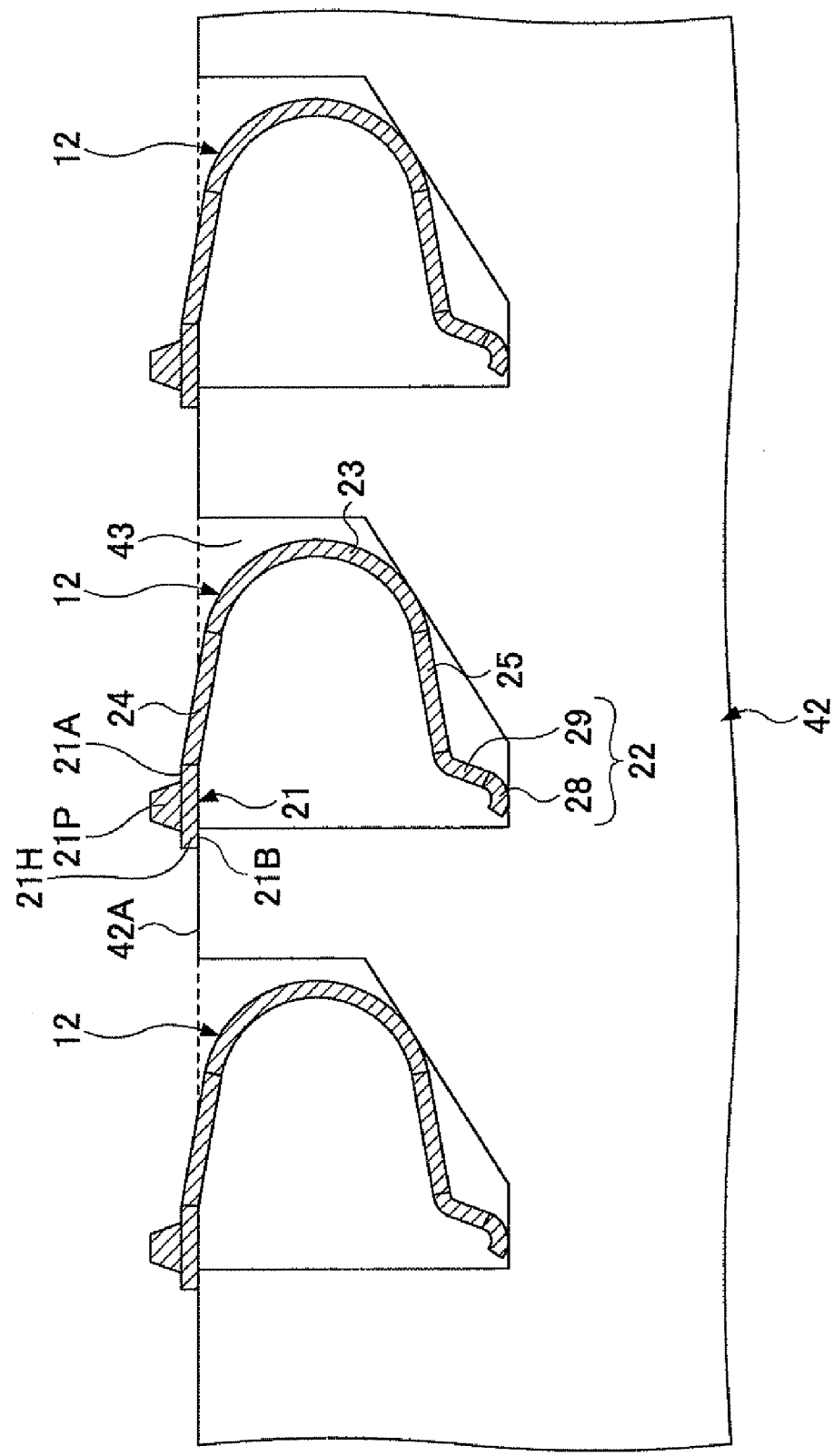

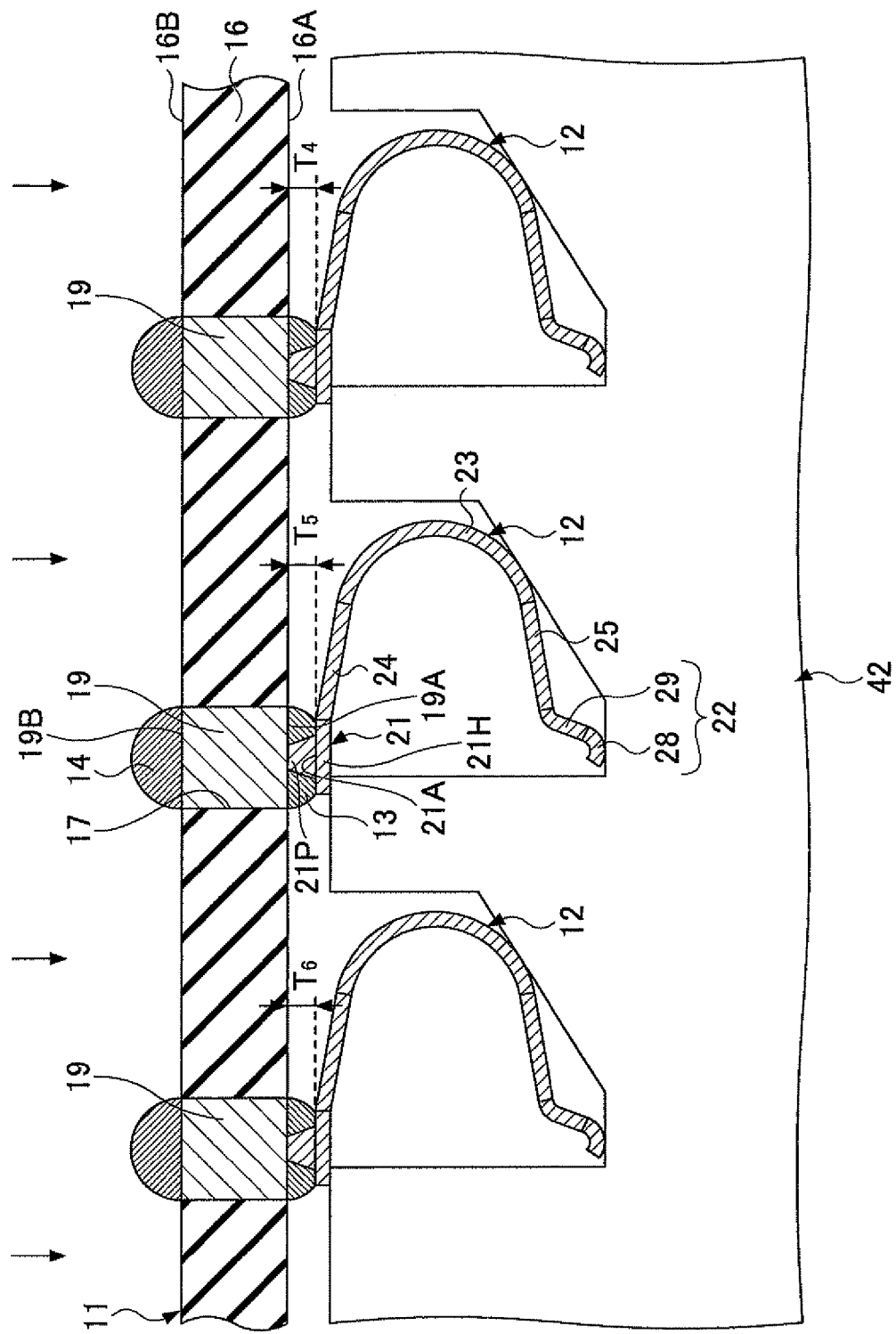

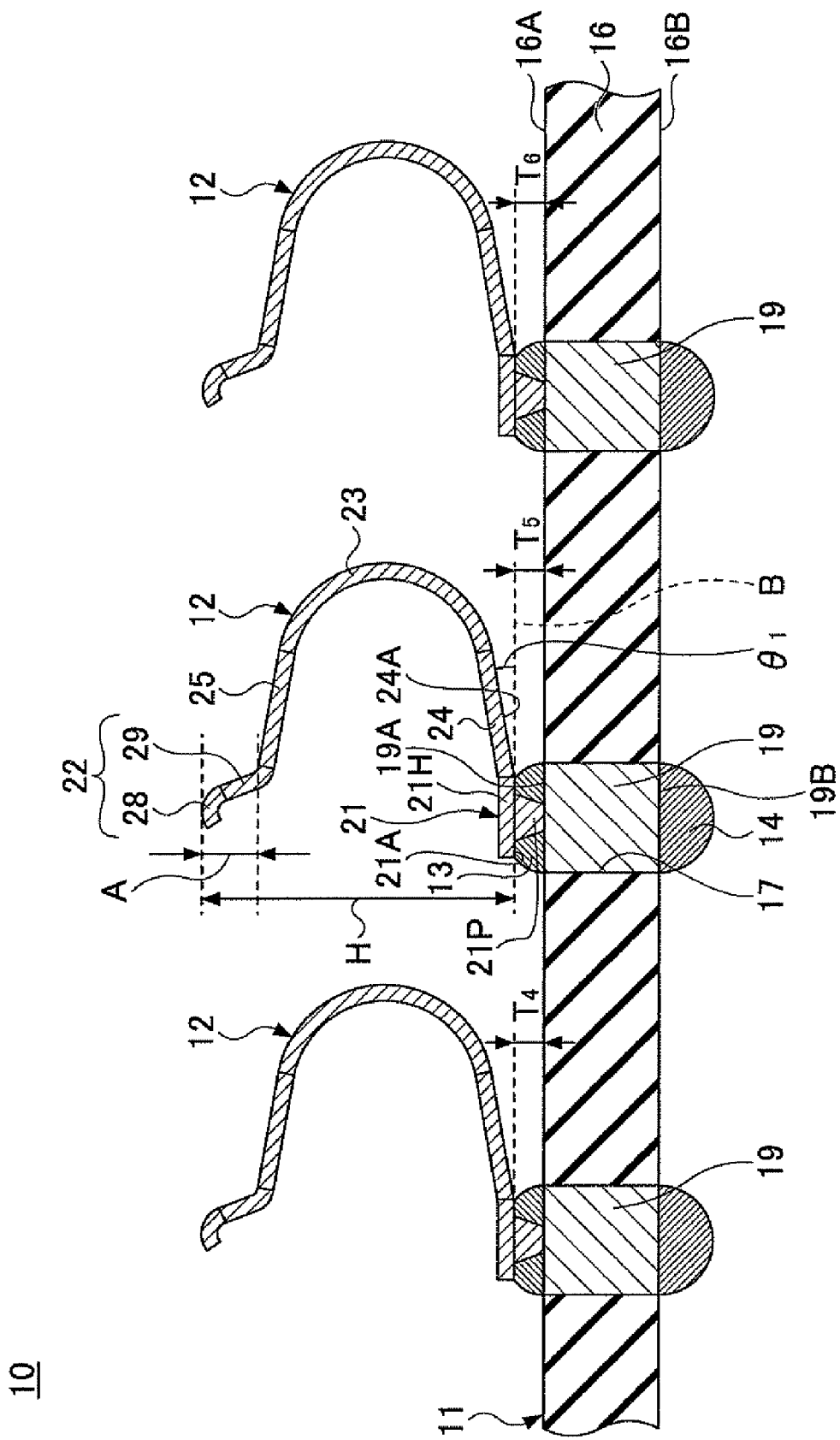

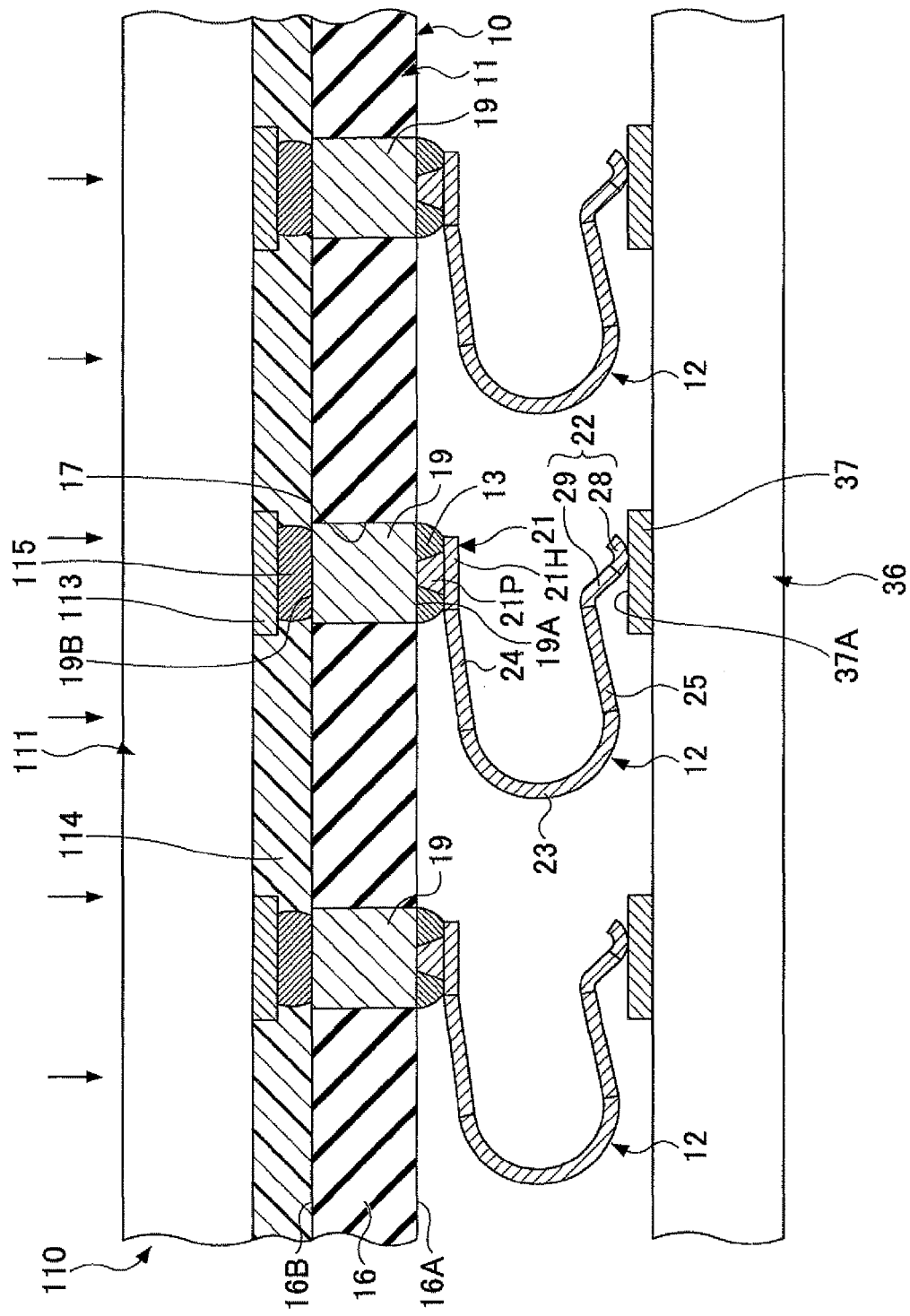

BOARD HAVING CONNECTION TERMINAL

CROSS-REFERENCE TO RELATED APPLICATION

The present application is based upon and claims the benefit of priority of Japanese Patent Application No. 2009-158994, filed on Jul. 3, 2009, the entire contents of which are incorporated herein by reference.

BACKGROUND OF THE INVENTION

1. Field of the Invention

The present invention relates to a board having a connection terminal with a spring property.

2. Description of the Related Art

FIG. 1 is a cross-sectional view of a conventional board having connection terminals, which is electrically connected to an object of connection (a connection target). Referring to FIG. 1, a conventional board having connection terminals, which is denoted by reference numeral 200, includes a board body 210, pads 220, connection terminals 230, and solder 240. An object of connection 300 includes a board body 310 and pads 320. The object of connection 300 is detachably and reattachably fastened to the board 200 with a clamp (not graphically illustrated) or the like provided on the board 200 or the object of connection 300.

The board body 210 includes an insulating layer (not graphically illustrated) and vias and interconnection patterns (not graphically illustrated) formed in or on the insulating layer. The pads 220 are provided on a surface 210A of the board body 210 to be electrically connected to the interconnection patterns (not graphically illustrated) formed in or on the board body 210.

The board body 310 includes an insulating layer (not graphically illustrated) and vias and interconnection patterns (not graphically illustrated) formed in or on the insulating layer. The pads 320 are provided on a surface 310A of the board body 310 to be electrically connected to the interconnection patterns (not graphically illustrated) formed in or on the board body 310.

The connection terminals 230 have spring properties. The connection terminals 230 have respective first end parts 230A electrically connected to the corresponding pads 220 on the board body 210 via the solder 240. With the board 200 being fastened to the object of connection 300, the connection terminals 230 have respective second end parts 230B pressed against the corresponding pads 320 on the board body 310 with a substantially constant pressure to be electrically connected to the pads 320.

Thus, the board 200 including the connection terminals 230 with spring properties can be easily attached to and detached from the object of connection 300 electrically. (See, for example, Japanese Laid-Open Patent Application No. 2000-299422.)

SUMMARY OF THE INVENTION

According to one aspect of the present invention, a board includes a board body; a first conductor provided at a first surface of the board body; and an electrically conductive connection terminal having a spring property, the connection terminal including a first end part fixed to the first conductor; a second end part to be connected to a first object of connection to be placed opposite the first surface of the board body; and a projection part provided on the first end part so as to project toward the first conductor.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

BRIEF DESCRIPTION OF THE DRAWINGS

Other objects, features and advantages of the present invention will become more apparent from the following detailed description when read in conjunction with the accompanying drawings, in which:

FIG. 4 is a plan view of the structure illustrated in FIG. 3 according to the first embodiment of the present invention;

FIG. 5 is a cross-sectional view of the connection-terminals-equipped board, which is electrically connected to an object of connection and a mounting board, according to the first embodiment of the present invention;

FIGS. 6A through 6E are diagrams illustrating a process of manufacturing a connection-terminals-equipped board according to the first embodiment of the present invention;

FIG. 19 is a diagram illustrating an application of the present invention to a semiconductor package according to an eighth embodiment of the present invention.

DETAILED DESCRIPTION OF THE PREFERRED EMBODIMENTS

Figure 1:
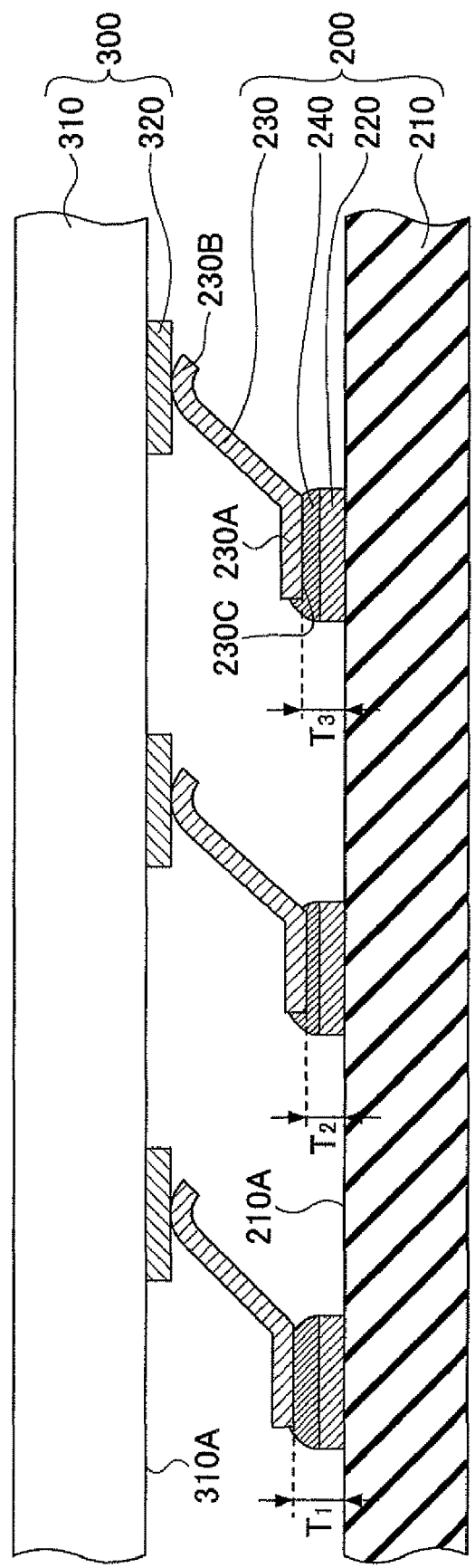
FIG. 1 is a cross-sectional view of a conventional board having connection terminals, which is electrically connected to an object of connection.

According to the conventional board 200 as illustrated in FIG. 1, however, surfaces 230C of the first end parts 230A of the connection terminals 230, facing toward the surface 210A of the board body 210, are flat and smooth without any function of defining intervals $T_1$ through $T_3$ between the surfaces 230C and the surface 210A. Accordingly, when joining the first end parts 230A of the connection terminals 230 to the corresponding pads 220 via the solder 240, the intervals $T_1$ through $T_3$ differ in value from one another, so that the interval (distance) between the surfaces 230C and the surface 210A cannot be kept uniform. If the interval between the surfaces 230C and the surface 210A cannot be kept uniform, the solder 240 may be too little in amount, which causes the problem of reduced reliability of the connections between the connection terminals 230 and the corresponding pads 220.

Further, in this case, if it is assumed that the same amount of the solder 240 is on each of the pads 220, solder wicking may occur, where the solder 240 travels to parts of the connection terminals 230 other than the first end parts 230A, that is, the inclined parts of the connection terminals 230, as the interval between the surfaces 230C and the surface 210A decreases. Such solder wicking degrades the spring characteristic of the connection terminals 230, and is therefore not preferable.

Thus, it is desirable to keep the interval between one end parts of connection terminals and a board (body) uniform. However, the conventional board having connection terminals has a problem in that it is difficult to keep this interval uniform.

According to one aspect of the present invention, a board having connection terminals is provided that is capable of keeping the interval between one end parts of the connection terminals and a board body uniform.

A description is given, with reference to the accompanying drawings, of embodiments of the present invention.

[a] First Embodiment

First, an overview is given of a structure of a board having connection terminals, which may be hereinafter referred to as a connection-terminals-equipped board, according to a first embodiment of the present invention.

Figure 2:
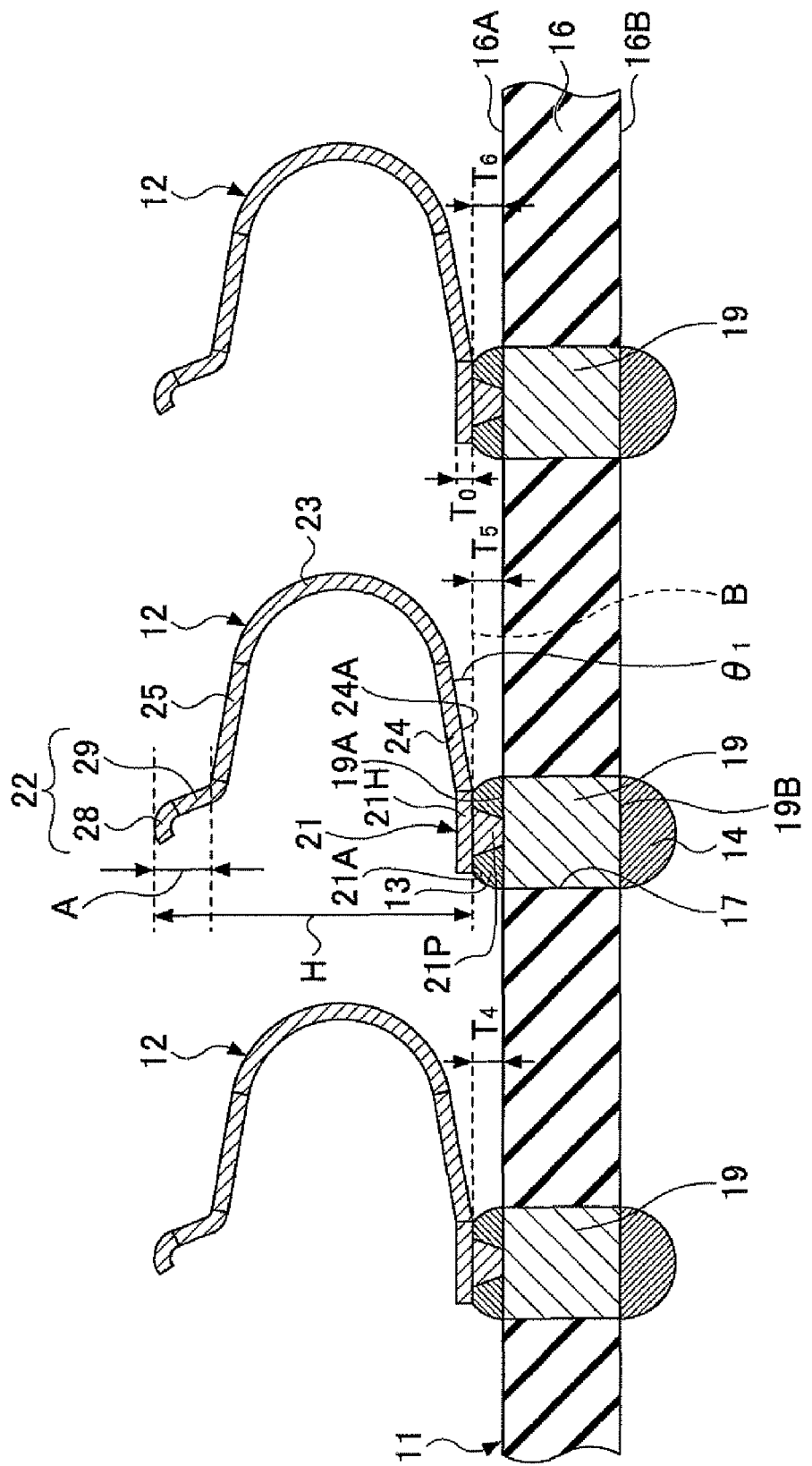
FIG. 2 is a cross-sectional view of a connection-terminals-equipped board according to a first embodiment of the present invention.

FIG. 2 is a cross-sectional view of a connection-terminals-equipped board according to the first embodiment of the present invention. Referring to FIG. 2, a connection-terminals-equipped board 10 according to the first embodiment includes a board 11, multiple connection terminals 12, multiple connection members 13, and multiple external connection members 14.

The board 11 includes a plate-shaped board body 16, multiple through holes 17, and multiple through electrodes 19, which are first conductors. Examples of the board body 16 include a silicon substrate, stacked insulating layers, and a multilayer interconnection structure (wiring board) having multiple vias and multiple interconnects provided in or on multiple insulating layers. The through holes 17 are formed through the board body 16. The through holes 17 may be, for example, 100 μm to 300 μm in diameter.

The through electrodes 19 are provided in the respective through holes 17. The through electrodes 19 have respective first end faces 19A exposed at a surface 16A of the board body 16 (a first surface of the board body 16) to be in substantially the same plane as the surface 16A. The through electrodes 19 have respective second end faces 19B exposed at a surface 16B of the board body 16 (a second surface of the board body 16) to be in substantially the same plane as the surface 16B. Examples of the material of the through electrodes 19 include Cu.

In this embodiment, a description is given below of the case of providing the through electrodes 19 in the board body 16 of silicon as an example of the board 11. Further, an insulating film such as a $SiO_2$ film (not graphically illustrated) is formed between the through electrodes 19 and the board body 16 and on the surfaces 16A and 16B of the board body 16.

Figure 3:
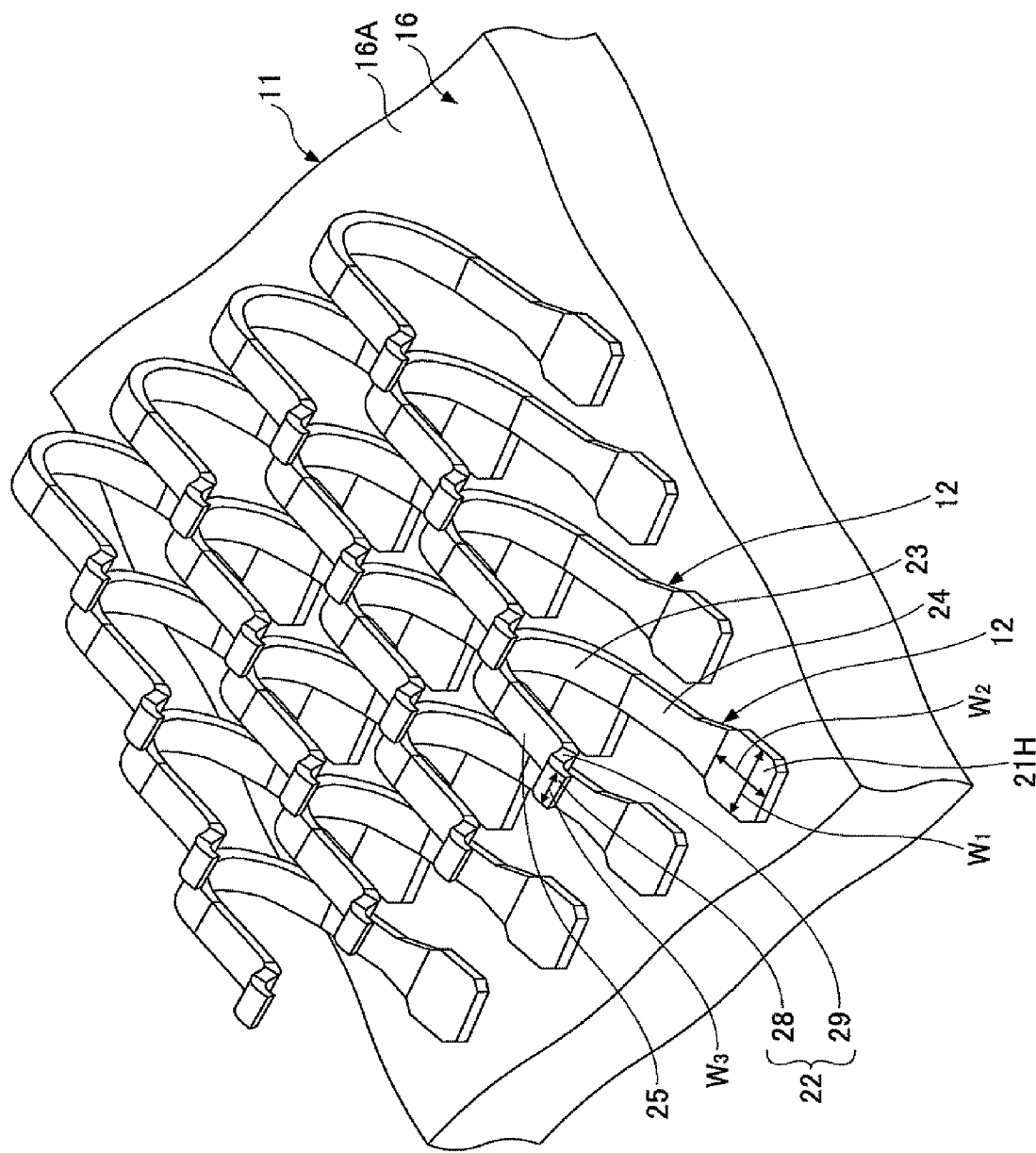
FIG. 3 is a schematic diagram illustrating an arrangement of connection terminals illustrated in FIG. 2 according to the first embodiment of the present invention.

FIG. 3 is a schematic diagram illustrating an arrangement of the connection terminals 12 illustrated in FIG. 2, and FIG. 4 is a plan view of the structure illustrated in FIG. 3. In FIG. 3 and FIG. 4, the same elements as those illustrated in FIG. 2 are referred to by the same reference numerals, and a description thereof may be omitted. In FIG. 4, C indicates a direction in which the connection terminals 12 are arranged. Hereinafter, this direction is referred to as "arrangement direction C."

Referring to FIG. 2 through FIG. 4, the connection terminals 12, which have spring properties, include respective first connection parts 21, second connection parts 22, spring parts 23, first support parts 24, and second support parts 25.

In the individual connection terminals 12, the first connection part 21 includes a plate-shaped part 21H and a projection part 21P formed on a surface 21A of the plate-shaped part 21H on the side facing toward the board 11. The projection part 21P may be formed either as a unitary structure with the plate-shaped part 21H or as a separate body on the plate-shaped part 21H so as to project toward the board body 16. A width $W_1$ and a width $W_2$ of the plate-shaped part 21H may be, for example, 0.4 mm each. (See FIG. 3.) A thickness $T_0$ of the plate-shaped part 21H may be, for example, 0.08 mm. (See FIG. 2.) The projection part 21P may have, for example, the shape of a frustum of a cone (or a truncated cone shape). The surface of the projection part 21P on the side of the surface 21A of the plate-shaped part 21H may be, for example, 50 μm to 200 μm in diameter. A frustum of a cone is the part of the cone contained between the base and a plane parallel to the base that intersects the cone.

The first connection parts 21 are fixed to the first end faces 19A of the corresponding through electrodes 19 by the connection members 13. That is, the first connection parts 21 are electrically connected to the corresponding through electrodes 19. The connection members 13 are not present at all or are present in an extremely small quantity (are extremely thin) between the end portions of the projection parts 21P of the first connection parts 21 and the first end faces 19A of the through electrodes 19. As a result, intervals $T_4$, $T_5$, and $T_6$ between the surfaces 21A of the plate-shaped parts 21H and the board 11 (the surface 16A of the board body 16) are defined by the heights (vertical dimensions) of the projection parts 21P, so that the intervals $T_4$, $T_5$, and $T_6$ are substantially the same. That is, the projection parts 21P of the first connection parts 21 make it possible to keep the intervals $T_4$, $T_5$, and $T_6$ uniform between the surfaces 21A of the plate-shaped parts 21H and the board 11 (the surface 16A of the board body 16). The heights of the projection parts 21P, which are nearly equal to the intervals $T_4$, $T_5$, and $T_6$, may be, for example, 50 μm to 100 μm.

Further, since it is possible to keep the intervals $T_4$, $T_5$, and $T_6$ uniform between the surfaces 21A of the plate-shaped parts 21H and the board 11 (the surface 16A of the board body 16), it is possible to keep the connection members 13 the same in amount in the gaps between the surfaces 21A of the plate-shaped parts 21H and the board 11. Accordingly, it is possible to prevent the wicking of the connection members 13 to parts of the connection terminals 12 other than the first connection parts 21 (such as the spring parts 23 and the first support parts 24). As a result, it is possible to prevent the degradation of the spring properties of the connection terminals 12.

The second connection parts 22 are positioned above the first connection parts 21 so as to face toward the first connection parts 21. The second connection parts 22 are electrically connected to the corresponding first connection parts 21 via the spring parts 23, the first support parts 24, and the second support parts 25. Each of the second connection parts 22 includes a contact part 28 and a projection part 29.

FIG. 5 is a cross-sectional view of the connection-terminals-equipped board 10 according to the first embodiment, which is electrically connected to an object of connection and a mounting board. In FIG. 5, the same elements as those described above are referred to by the same reference numerals, and a description thereof may be omitted.

Referring to FIG. 5, when the connection terminals 12 are pressed by pads 34 of an object of connection 33 (a connection target or an object or target to be connected), which may be an electric component such as a semiconductor package, a wiring board, or a semiconductor chip, the contact parts 28 come into contact with surfaces 34A of the pads 34. When the connection terminals 12 are pressed by the pads 34, the contact parts 28 primarily move in a thickness direction of the board body 16 (in other words, a direction orthogonal to the surfaces 34A of the pads 34). Portions of the contact parts 28 which portions come into contact with the surfaces 34A of the pads 34 are rounded in shape.

By thus rounding the portions of the contact parts 28 which portions come into contact with the surfaces 34A of the pads 34, it is possible to prevent the pads 34 from being damaged by the contact parts 28 when the contact parts 28 are pressed by the pads 34.

Further, when the pads 34 provided on the object of connection 33 press the second connection parts 22, the spring parts 23 deform to cause the contact parts 28 to come into contact with the surfaces 34A of the pads 34 with the second connection parts 22 being displaced in a direction to approach the first connection parts 21 (specifically, a direction, orthogonal to the surfaces 34A of the pads 34 contacted by the second connection parts 22, to bring the second connection parts 22 closer to the first connection parts 21).

This prevents the second connection parts 22 from moving greatly along the surfaces 34A of the pads 34 when the second connection parts 22 come into contact with the surfaces 34A of the pads 34. As a result, it is possible to arrange the pads 34 on the object of connection 33 at a narrow pitch.

At the time of actually connecting the object of connection 33 and the connection-terminals-equipped board 10 electrically, the object of connection 33 is pressed against and fastened to the connection-terminals-equipped board 10 with a clamp or the like (not graphically illustrated) provided on a mounting board 36 or the connection-terminals-equipped board 10.

Referring to FIG. 2 through FIG. 5, in the individual connection terminals 12, the projection part 29 has a first end part forming a unitary structure with the second support part 25 and has a second end part forming a unitary structure with the contact part 28. The projection part 29 projects from the second support part 25 in a direction toward the corresponding pad 34 (in a direction away from the first connection part 21).

In the individual connection terminals 12, the projection part 29 forming a unitary structure with the contact part 28 and the second support part 25 and projecting from the second support part 25 in a direction toward the corresponding pad 34 (in a direction away from the first connection part 21) is thus provided between the connection part 28 and the second support part 25. This makes it possible to prevent the contact of the object of connection 33 and the second support parts 25 due to the deformation of the spring parts 23 when the pads 34 of the object of connection 33 presses the contact parts 28. Accordingly, it is possible to prevent the connection terminals 12 and the object of connection 33 from being damaged.

The amount of projection A (the amount of projection with reference to the connections of the second support parts 25 and the projection parts 29) of the second connection parts 22, with the second connection parts 22 being out of contact with the corresponding pads 34 of the object of connection 33, may be, for example, 0.3 mm. (See FIG. 2.) Further, a width $W_3$ of each of the second connection parts 22 may be, for example, 0.2 mm. (See FIG. 3 or FIG. 4.) The second connection parts 22 may be, for example, 0.08 mm in thickness.

In the individual connection terminals 12, the spring part 23 is positioned between the first support part 24 and the second support part 25, forming a unitary structure with the first support part 24 and the second support part 25. The spring part 23 has a curved shape such as a C-letter shape and a spring property.

The spring part 23 is configured to cause the second connection part 22 to move back in a direction toward the corresponding pad 34 of the object of connection 33 when the second connection part 22 is pressed by the pad 34, thereby allowing the second connection part 22 and the pad 34 to come into contact without fixing them to each other. The spring part 23 may be equal in width and thickness to, for example, the second connection part 22. In the individual connection terminals 12 according to this embodiment, the second connection part 22, the spring part 23, the first support part 24, and the second support part 25 unitarily function as a spring. A portion of each of the connection terminals 12 corresponding to the second connection part 22, the spring part 23, the first support part 24, and the second support part 25 may have a spring constant of, for example, 0.6 N/mm to 0.8 N/mm.

In the individual connection terminals 12, the first support part 24 is positioned between the spring part 23 and the first connection part 21. The first support part 24 has a first end part forming a unitary structure with a first end part of the spring part 23 and has a second end part forming a unitary structure with the first connection part 21. The first support part 24 has a plate shape.

The first support parts 24 is configured so that an angle $\theta_1$ (FIG. 2) formed by a plane B passing through (containing) the surface 21A of the plate-shaped part 21H on the side facing toward the board 11 and a surface 24A of the first support part 24 on the side facing toward the board 11 is an acute angle. The angle $\theta_1$ may be, for example, 5 degrees to 15 degrees.

By thus causing this angle $\theta_1$ to be an acute angle, it is possible to prevent the contact of the board 11 and the first support parts 24 due to the deformation of the spring parts 23 when the pads 34 of the object of connection 33 press the contact parts 28. As a result, it is possible to prevent the connection terminals 12 and the board 11 from being damaged. The first support parts 24 thus configured may be equal in width and thickness to, for example, the second connection parts 22.

In the individual connection terminals 12, the second support part 25 is positioned between the spring part 23 and the second connection part 22. The second support part 25 has a first end part forming a unitary structure with the second end part of the spring part 23 and has a second end part forming a unitary structure with the second connection part 22 (the projection part 29). The second support part 25 has a plate shape. The second support part 25 may be equal in width and thickness to, for example, the second connection part 22.

As illustrated in FIG. 4, the connection terminals 12 are arranged (arrayed) to form a predetermined angle $\theta_2$ with the arrangement direction C of the connection terminals 12. In other words, the connection terminals 12 are placed with an inclination relative to (at an angle to) the arrangement direction C of the connection terminals 12. The predetermined angle $\theta_2$ may be, for example, 25 degrees to 35 degrees.

Thus, the connection terminals 12 are oriented with an inclination relative to the arrangement direction C of the connection terminals 12. This makes it possible to dispose a larger number of connection terminals 12 per unit area than in the case of arranging the connection terminals 12 parallel to the arrangement direction C. This allows the pads 34 of the object of connection 33, which are to be connected to the second connection parts 22, to be arranged (arrayed) at a narrow pitch.

Each of the connection terminals 12 configured as described above may be manufactured by, for example, stamping a metal plate (of, for example, a Cu-based alloy) having a predetermined shape (not graphically illustrated); thereafter forming a Ni plating film (for example, 1 μm to 3 μm in thickness) on the entire surfaces of the stamped metal plate; then forming a Au plating film (for example, 0.3 μm to 0.5 μm in thickness) partially on the Ni plating film, that is, on parts of the Ni plating film formed on parts of the stamped metal plate corresponding to the first connection part 21 and the contact part 28; and then bending the stamped metal plate having the Ni plating film and the Au plating film formed thereon. Examples of the Cu-based alloy as the material of the metal plate include phosphor bronze and beryllium copper. The projection part 21P may be formed at the same time that the metal plate (of, for example, a Cu-based alloy) (not graphically illustrated) is stamped. As described below in a seventh embodiment, however, the projection part may be formed using plating instead of stamping depending on its shape.

Alternatively, each of the connection terminals 12 may be formed by etching a metal plate (of, for example, a Cu-based alloy) (not graphically illustrated) into a predetermined shape and then bending the etched metal plate. In the state illustrated in FIG. 2 (where the pads 34 of the object of connection 33 are not pressed by the second connection parts 22 of the corresponding connection terminals 12), a height H of the connection terminals 12 may be, for example, 1.5 mm.

Referring to FIG. 2 and FIG. 5, the connection members 13 are provided on the first end faces 19A of the respective through electrodes 19. The connection members 13 fix the first connection parts 21 of the connection terminals 12 to the first end faces 19A of the corresponding through electrodes 19. Thereby, the connection members 13 electrically connect the connection terminals 12 and the corresponding through electrodes 19. Examples of the material of the connection members 13 include solder and electrically conductive paste. In this case, examples of the solder include Pb alloys, Sn—Cu alloys, Sn—Ag alloys, and Sn—Ag—Cu alloys. Further, examples of the electrically conductive paste include electrically conductive resin paste (such as Ag paste having Ag particles contained in an epoxy resin).

The external connection members 14 are provided on the second end faces 19B of the through electrodes 19. The external connection members 14 are terminals to be connected to corresponding pads 37 provided on the mounting board 36 such as a motherboard. Thereby, the external connection members 14 electrically connect the board 11 and the mounting board 36. Examples of the material of the external connection members 14 include solder and electrically conductive paste. In this case, examples of the solder include Pb alloys, Sn—Cu alloys, Sn—Ag alloys, and Sn—Ag—Cu alloys. Further, examples of the electrically conductive paste include electrically conductive resin paste (such as Ag paste having Ag particles contained in an epoxy resin). A description is thus given above of a schematic structure of the connection-terminals-equipped board 10.

Next, a description is given schematically of a method of manufacturing a connection-terminals-equipped board according to the first embodiment of the present invention.

FIGS. 6A through 6E are diagrams illustrating a process of manufacturing a connection-terminals-equipped board according to the first embodiment of the present invention. In FIGS. 6A through 6E, the same elements as those of the connection-terminals-equipped board 10 according to the first embodiment are referred to by the same reference numerals, and a description thereof may be omitted. Further, in FIGS. 6A and 6D, the board 11 illustrated in FIG. 2 and FIG. 5 is graphically illustrated upside down.

A description is given, with reference to FIGS. 6A through 6E, of the connection-terminals-equipped board 10 according to the first embodiment.

Figure 6A:
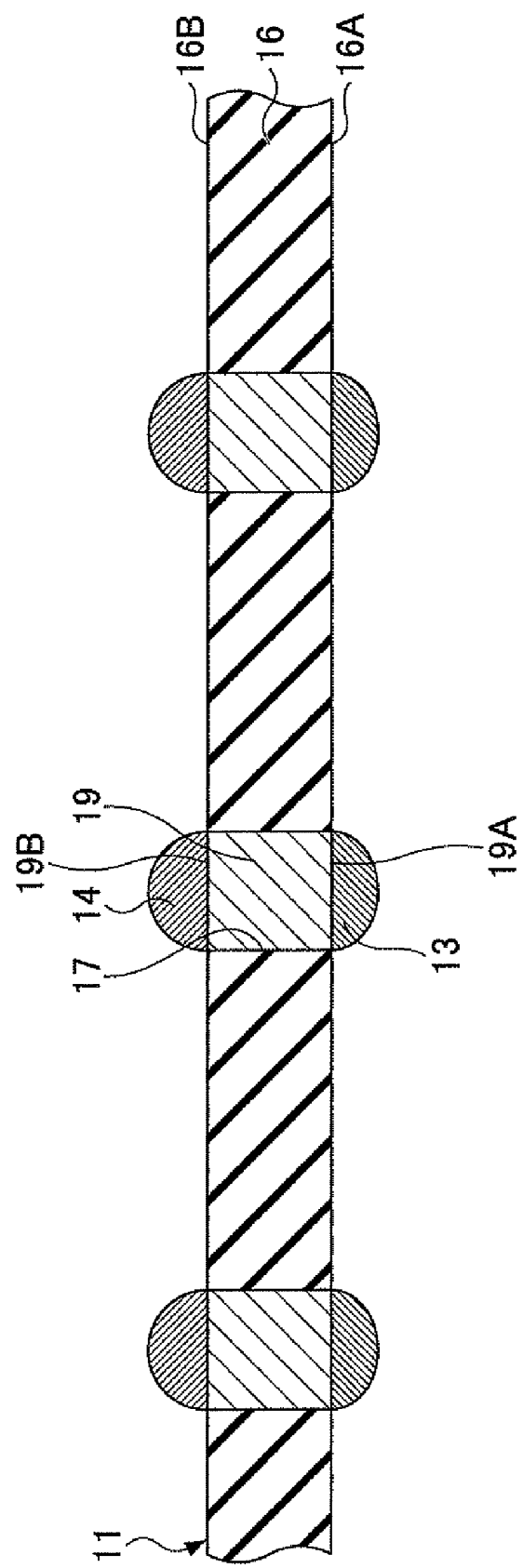

First, in the process illustrated in FIG. 6A, the board 11 including the board body 16 with the multiple through holes 17; the through electrodes 19; the external connection members 14; and the connection members 13 is formed by a known method. At this point, the through electrodes 19 are formed so that their first end faces 19A are substantially level with the surface 16A of the board body 16 and their second end faces 19B are substantially level with the surface 16B of the board body 16.

Examples of the board body 16 include a silicon substrate, stacked insulating layers, and a multilayer interconnection structure (wiring board) having multiple vias and multiple interconnects provided in or on multiple insulating layers. The through holes 17 may be, for example, 100 μm to 300 μm in diameter.

The through electrodes 19 may be formed by, for example, plating. Further, in the case of using a silicon substrate as the board body 16, an insulating film (not graphically illustrated) that electrically isolates the board body 16 and the through electrodes 19 is formed on the side surfaces of the through holes 17. Further, an insulating film (not graphically illustrated) is formed also on each of the surfaces 16A and 16B of the board body 16. Examples of the material of the through electrodes 19 include Cu.

Next, the connection members 13 are formed on the first end faces 19A of the respective through electrodes 19, and the external connection members 14 are formed on the second end faces 19B of the respective through electrodes 19. Examples of the materials of the connection members 13 and the external connection members 14 include solder and electrically conductive paste. In this case, examples of the solder include Pb alloys, Sn—Cu alloys, Sn—Ag alloys, and Sn—Ag—Cu alloys. Further, examples of the electrically conductive paste include electrically conductive resin paste (such as Ag paste having Ag particles contained in an epoxy resin).

Figure 6B:
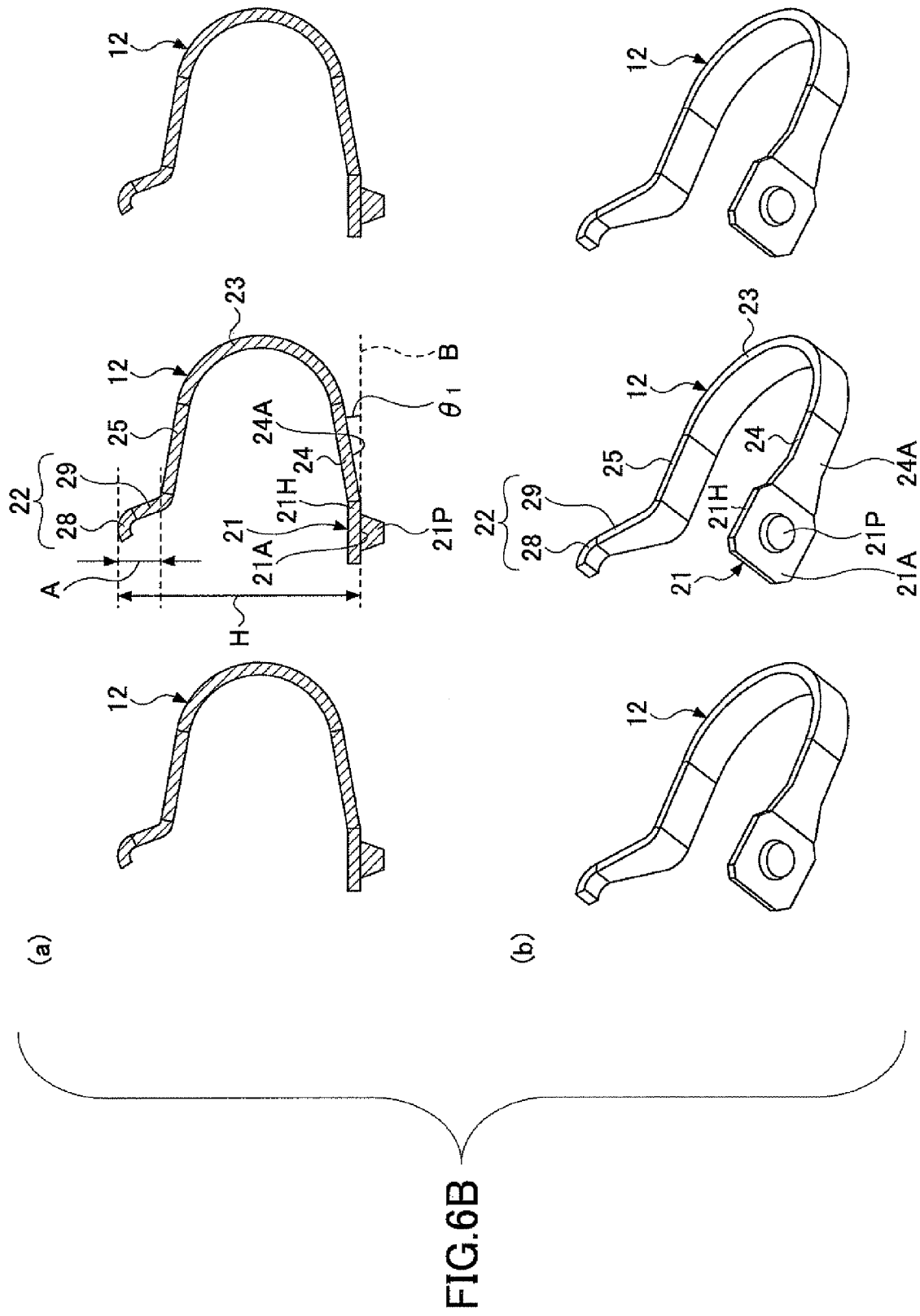

Next, in the process illustrated in FIG. 6B, the multiple connection terminals 12 each including the first connection part 21 having the plate-shaped part 21H and the projection part 21P, the second connection part 22, the spring part 23 having a spring property, the first support part 24, and the second support part 25 are formed. In FIG. 6B, (a) is a cross-sectional view of the connection terminals 12, and (b) is a perspective view of the connection terminals 12.

For example, each of the connection terminals 12 is manufactured by, for example, stamping a metal plate (of, for example, a Cu-based alloy) having a predetermined shape (not graphically illustrated); thereafter forming a Ni plating film (for example, 1 μm to 3 μm in thickness) on the entire surfaces of the stamped metal plate; then forming a Au plating film (for example, 0.3 μm to 0.5 μm in thickness) partially on the Ni plating film, that is, on parts of the Ni plating film formed on parts of the stamped metal plate corresponding to the first connection part 21 and the contact part 28; and then bending the stamped metal plate having the Ni plating film and the Au plating film formed thereon. Examples of the Cu-based alloy as the material of the metal plate include phosphor bronze and beryllium copper. The projection part 21P may be formed by press at the same time that the metal plate (of, for example, a Cu-based alloy) (not graphically illustrated) is stamped.

Alternatively, each of the connection terminals 12 may be formed by etching a metal plate (of, for example, a Cu-based alloy) (not graphically illustrated) into a predetermined shape and then bending the etched metal plate.

In the connection terminals 12 formed to have the above-described configuration, the first connection parts 21 have the respective projection parts 21P. Accordingly, it is possible to keep the interval (distance) between the surfaces 21A of the plate-shaped parts 21H and the board 11 (the surface 16A of the board body 16) uniform at the time of fixing the connection terminals 12 to the first end faces 19A of the through electrodes 19 of the board 11. Further, since it is possible to keep the interval (distance) between the surfaces 21A of the plate-shaped parts 21H and the board 11 (the surface 16A of the board body 16) uniform at the time of fixing the connection terminals 12 to the first end faces 19A of the through electrodes 19 of the board 11, it is possible to keep the connection members 13 the same in amount in the gaps between the surfaces 21A of the plate-shaped parts 21H and the board 11. Accordingly, it is possible to prevent the wicking of the connection members 13 to parts of the connection terminals 12 other than the first connection parts 21 (such as the spring parts 23 and the first support parts 24). As a result, it is possible to prevent the degradation of the spring properties of the connection terminals 12.

Further, when the pads 34 provided on the object of connection 33 press the second connection parts 22, the spring parts 23 deform to cause the second connection parts 22 to come into contact with the surfaces 34A of the pads 34 with the second connection parts 22 being displaced in a direction to approach the first connection parts 21 (specifically, a direction, orthogonal to the surfaces 34A of the pads 34 contacted by the second connection parts 22, to bring the second connection parts 22 closer to the first connection parts 21). This eliminates the need for increasing the pads 34 laterally (in a direction along the surfaces 34A) in size, thus making it possible to arrange the pads 34 at a narrow pitch on the object of connection 33. (See FIG. 2 and FIG. 5.)

Further, in the process illustrated in FIG. 6B, which may be referred to as a connection terminal formation process, it is desirable to form the connection terminals 12 so that their contact parts 28 which come into contact with the surfaces 34A of the pads 34 are rounded in shape. This makes it possible to prevent the pads 34 from being damaged by the contact parts 28 when the contact parts 28 are pressed by the pads 34.

Further, in the connection terminal formation process, it is desirable to form the projection part 29 between the contact part 28 and the second support part 25 of each of the connection terminals 12, the projection part 29 projecting from the second support part 25 in a direction toward the corresponding pad 34 of the object of connection 33. This makes it possible to prevent the object of connection 33 and the second support parts 25 from coming into contact when the pads 34 of the object of connection 33 press the corresponding contact parts 28. Accordingly, it is possible to prevent the connection terminals 12 and the object of connection 33 from being damaged by contacting each other.

The amount of projection A (the amount of projection with reference to the connections of the second support parts 25 and the projection parts 29) of the second connection parts 22, with the second connection parts 22 being out of contact with the corresponding pads 34 of the object of connection 33, may be, for example, 0.3 mm. (See FIG. 2.)

Further, in the connection terminal formation process, it is desirable to form each of the connection terminals 12 so that the angle $\theta_1$ (FIG. 2) formed by the plane B passing through (containing) the surface 21A of the plate-shaped part 21H on the side facing toward the board 11 and a surface 24A of the first support part 24 on the side facing toward the board 11 is an acute angle.

By thus causing this angle $\theta_1$ to be an acute angle (for example, 5 degrees to 15 degrees), it is possible to prevent the contact of the board 11 and the first support parts 24 due to the deformation of the spring parts 23 when the pads 34 of the object of connection 33 press the contact parts 28. As a result, it is possible to prevent the connection terminals 12 and the board 11 from being damaged.

In the state where the second connection parts 22 are not pressed by the pads 34 of the object of connection 33, the height H of the connection terminals 12 may be, for example, 1.5 mm.

Next, in the process illustrated in FIG. 6C, the connection terminals 12 are placed in multiple terminal receiving parts 43 formed in a terminal alignment member 42 with one in each of the terminal receiving parts 43. Specifically, for example, the connection terminals 12 are placed one in each of the terminal receiving parts 43 by a transfer method or a pick-and-place method. At this point, the connection terminals 12 are placed in the terminal receiving parts 43 so that parts of surfaces 21B of the first connection parts 21 opposite to the surfaces 21A come into contact with an upper surface 42A of the terminal alignment member 42.

Next, in the process illustrated in FIG. 6D, the connection members 13 of the structure illustrated in FIG. 6A are caused to melt by application of heat, and the molten connection members 13 and the projection parts 21P of the first connection parts 21 are brought into contact. Then, the board 11 is pressed from the direction of arrows so that the connection members 13 are not present at all or are present in an extremely small quantity (are extremely thin) between the end portions of the projection parts 21P of the first connection parts 21 and the first end faces 19A of the through electrodes 19. Then, the connection members 13 are hardened. Here, the first connection parts 21 have the projection parts 21P.

Accordingly, the projection parts 21P serve as stoppers to prevent the board 11 from being excessively pressed at the time of its pressing. It is possible to press the board 11 with sufficient force without a fear for overpressing in such a case where it is desirable to sufficiently press the board 11, for example, when the board 11 is warped.

As a result, the connection terminals 12 are fixed to the first end faces 19A of the corresponding through electrodes 19 with the connection members 13 being absent or present in an extremely small quantity (extremely thin) between the end portions of the projection parts 21P of the first connection parts 21 and the first end faces 19A of the through electrodes 19. Consequently, the intervals $T_4$ through $T_6$ between the surfaces 21A of the plate-shaped parts 21H and the board 11 (the surface 16A of the board body 16) are determined by the heights (vertical dimensions) of the projection parts 21P, so that the intervals $T_4$ through $T_6$ are substantially the same. That is, the projection parts 21P of the first connection parts 21 make it possible to keep the intervals $T_4$ through $T_6$ uniform between the surfaces 21A of the plate-shaped parts 21H and the board 11 (the surface 16A of the board body 16). The heights of the projection parts 21P, which are nearly equal to the intervals $T_4$ through $T_6$, may be, for example, 50 μm to 100 μm.

Further, since it is possible to keep the intervals $T_4$ through $T_6$ uniform between the surfaces 21A of the plate-shaped parts 21H and the board 11 (the surface 16A of the board body 16), it is possible to keep the connection members 13 uniform in amount in the gaps between the surfaces 21A of the plate-shaped parts 21H and the board 11. Accordingly, it is possible to prevent the wicking of the connection members 13 to parts of the connection terminals 12 other than the first connection parts 21 (such as the spring parts 23 and the first support parts 24). As a result, it is possible to prevent the degradation of the spring properties of the connection terminals 12.

Further, in the process illustrated in FIG. 6D, it is desirable to dispose the connection terminals 12 with an inclination relative to (at an angle to) the arrangement direction C of the connection terminals 12 as illustrated in FIG. 4 described above. Disposing the connection terminals 12 with an inclination relative to the arrangement direction C of the connection terminals 12 makes it possible to dispose a larger number of connection terminals 12 per unit area than in the case of arranging the connection terminals 12 parallel to the arrangement direction C. This allows the pads 34 of the object of connection 33, which are to be connected to the second connection parts 22, to be arranged at a narrow pitch.

Next, in the process illustrated in FIG. 6E, the board 11 having the connection terminals 12 fixed thereto is removed from the terminal alignment member 42 illustrated in FIG. 6D, and is turned upside down. Thereby, the connection-terminals-equipped board 10 according to the first embodiment is manufactured. An overview is thus given above of a method of manufacturing a connection-terminals-equipped board according to the first embodiment.

According to the connection-terminals-equipped board 10 of the first embodiment, the first connection parts 21 have the projection parts 21P. Accordingly, it is possible to keep a uniform interval (distance) between the surfaces 21A of the plate-shaped parts 21H and the board 11 (the surface 16A of the board body 16). Further, since it is possible to keep a uniform interval (distance) between the surfaces 21A of the plate-shaped parts 21H and the board 11 (the surface 16A of the board body 16), it is possible to keep the connection members 13 uniform in amount in the gaps between the surfaces 21A of the plate-shaped parts 21H and the board 11. Accordingly, it is possible to prevent the wicking of the connection members 13 to parts of the connection terminals 12 other than the first connection parts 21 (such as the spring parts 23 and the first support parts 24). As a result, it is possible to prevent the degradation of the spring properties of the connection terminals 12.

Further, when the pads 34 provided on the object of connection 33 press the second connection parts 22, the spring parts 23 deform to cause the second connection parts 22 to come into contact with the surfaces 34A of the pads 34 with the second connection parts 22 being displaced in a direction to approach the first connection parts 21 (specifically, a direction, orthogonal to the surfaces 34A of the pads 34 contacted by the second connection parts 22, to bring the second connection parts 22 closer to the first connection parts 21).

This prevents the second connection parts 22 from moving greatly along the surfaces 34A of the pads 34 when the second connection parts 22 come into contact with the surfaces 34A of the pads 34. As a result, it is possible to arrange the pads 34 on the object of connection 33 at a narrow pitch.

[b] Second Embodiment

Figure 7:
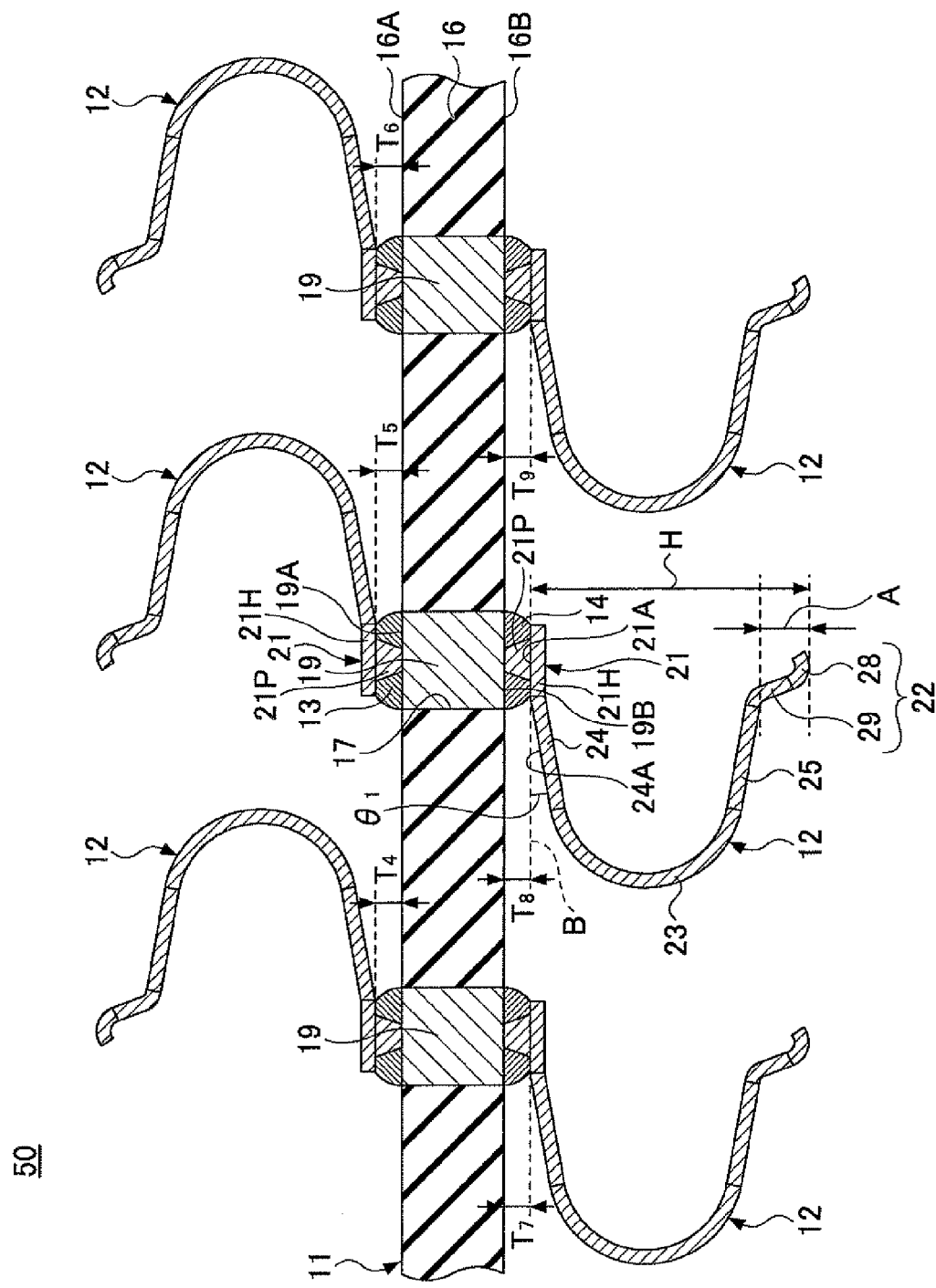
FIG. 7 is a cross-sectional view of a connection-terminals-equipped board according to a second embodiment of the present invention.
Figure 8:
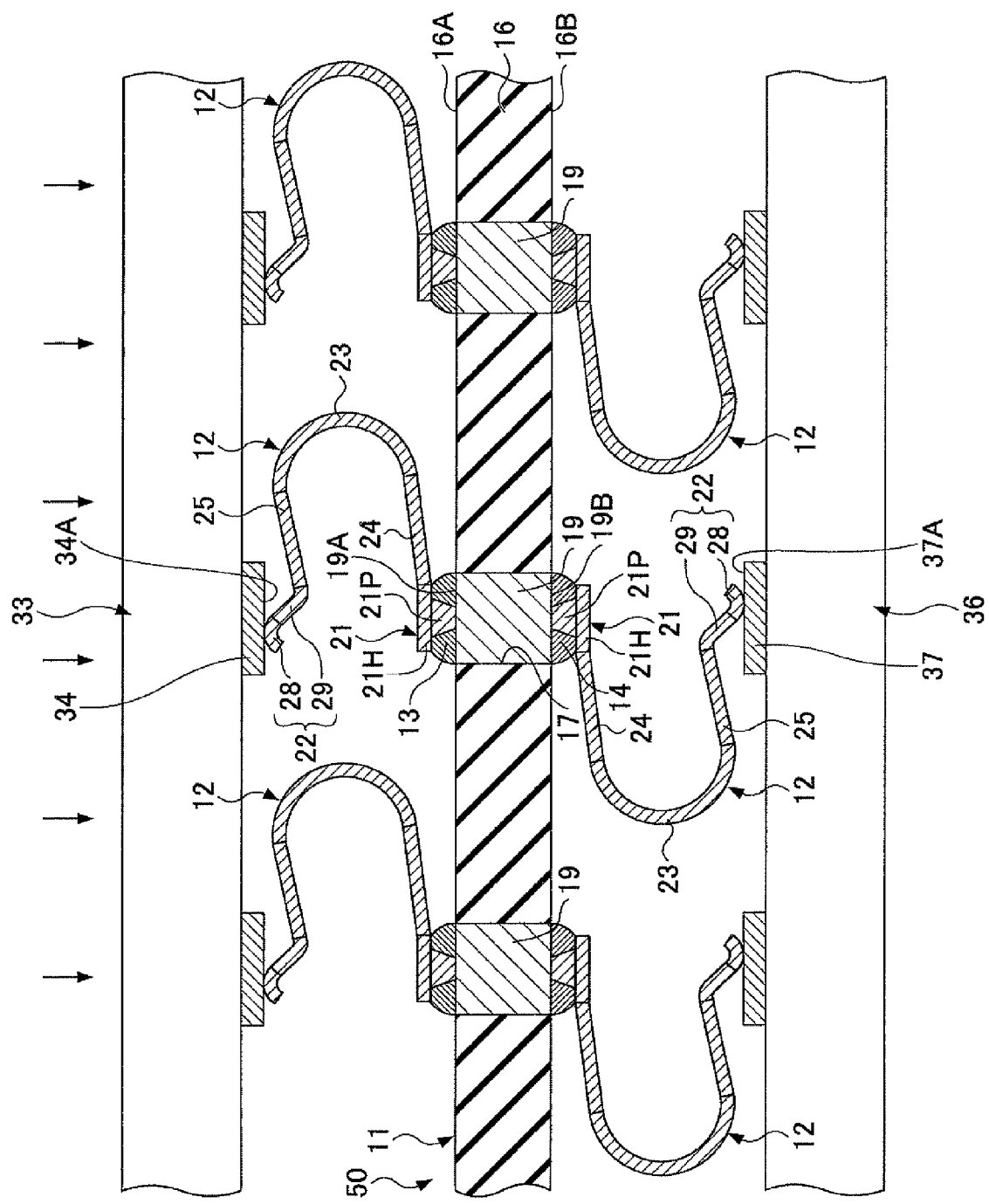
FIG. 8 is a cross-sectional view of the connection-terminals-equipped board, which is electrically connected to the object of connection and the mounting board, according to the second embodiment of the present invention.

FIG. 7 is a cross-sectional view of a connection-terminals-equipped board according to a second embodiment of the present invention. FIG. 8 is a cross-sectional view of the connection-terminals-equipped board, which is electrically connected to an object of connection and a mounting board, according to the second embodiment.

In FIG. 7, the same elements as those of the connection-terminals-equipped board 10 according to the first embodiment are referred to by the same reference numerals, and a description thereof may be omitted. Further, in FIG. 8, the same elements as those of the connection-terminals-equipped board of FIG. 7 are referred to by the same reference numerals, and a description thereof may be omitted.

Referring to FIG. 7 and FIG. 8, a connection-terminals-equipped board 50 according to the second embodiment has the same configuration as the connection-terminals-equipped board 10 according to the first embodiment except that the connection terminals 12 are provided also on the external connection members 14 of the connection-terminals-equipped board 10.

The connection terminals 12 provided on the external connection members 14 are positioned on the side of the surface 16B (second surface) of the board body 16, and are electrically connected to the corresponding through electrodes 19 via the external connection members 14. The second connection parts 22 of the connection terminals 12 placed on the side of the surface 16B of the board body 16 are electrically connected to the mounting board 36 by contacting surfaces 37A of the corresponding pads 37 without being fixed to the pads 37. Thereby, the connection-terminals-equipped board 50 is electrically connected to the mounting board 36 via the connection terminals 12 placed on the side of the surface 16B of the board body 16.

The external connection members 14 are not present at all or are present in an extremely small quantity (are extremely thin) between the end portions of the projection parts 21P of the first connection parts 21 and the second end faces 19B of the through electrodes 19. As a result, intervals $T_7$, $T_8$, and $T_9$ between the surfaces 21A of the plate-shaped parts 21H and the board 11 (the surface 16B of the board body 16) are defined by the heights (vertical dimensions) of the projection parts 21P, so that the intervals $T_7$, $T_8$, and $T_9$ are substantially the same. That is, the projection parts 21P of the first connection parts 21 make it possible to keep the intervals $T_7$, $T_8$, and $T_9$ uniform between the surfaces 21A of the plate-shaped parts 21H and the board 11 (the surface 16B of the board body 16). The heights of the projection parts 21P, which are nearly equal to the intervals $T_7$, $T_8$, and $T_9$, may be, for example, 50 µm to 100 µm.

Further, since it is possible to keep the intervals $T_7$, $T_8$, and $T_9$ uniform between the surfaces 21A of the plate-shaped parts 21H and the board 11 (the surface 16B of the board body 16), it is possible to keep the external connection members 14 uniform in amount in the gaps between the surfaces 21A of the plate-shaped parts 21H and the board 11. Accordingly, it is possible to prevent the wicking of the external connection members 14 to parts of the connection terminals 12 other than the first connection parts 21 (such as the spring parts 23 and the first support parts 24). As a result, it is possible to prevent the degradation of the spring properties of the connection terminals 12.

The connection-terminals-equipped board 50 configured as described above according to the second embodiment can produce the same effects as the connection-terminals-equipped board 10 according to the first embodiment.

Further, the connection-terminals-equipped board 50 according to the second embodiment can be manufactured by executing the same process as that of the method of manufacturing the connection-terminals-equipped board 10 according to the first embodiment except for executing the processes of FIGS. 6C and 6D described in the first embodiment twice.

[c] Third Embodiment

Figure 9:
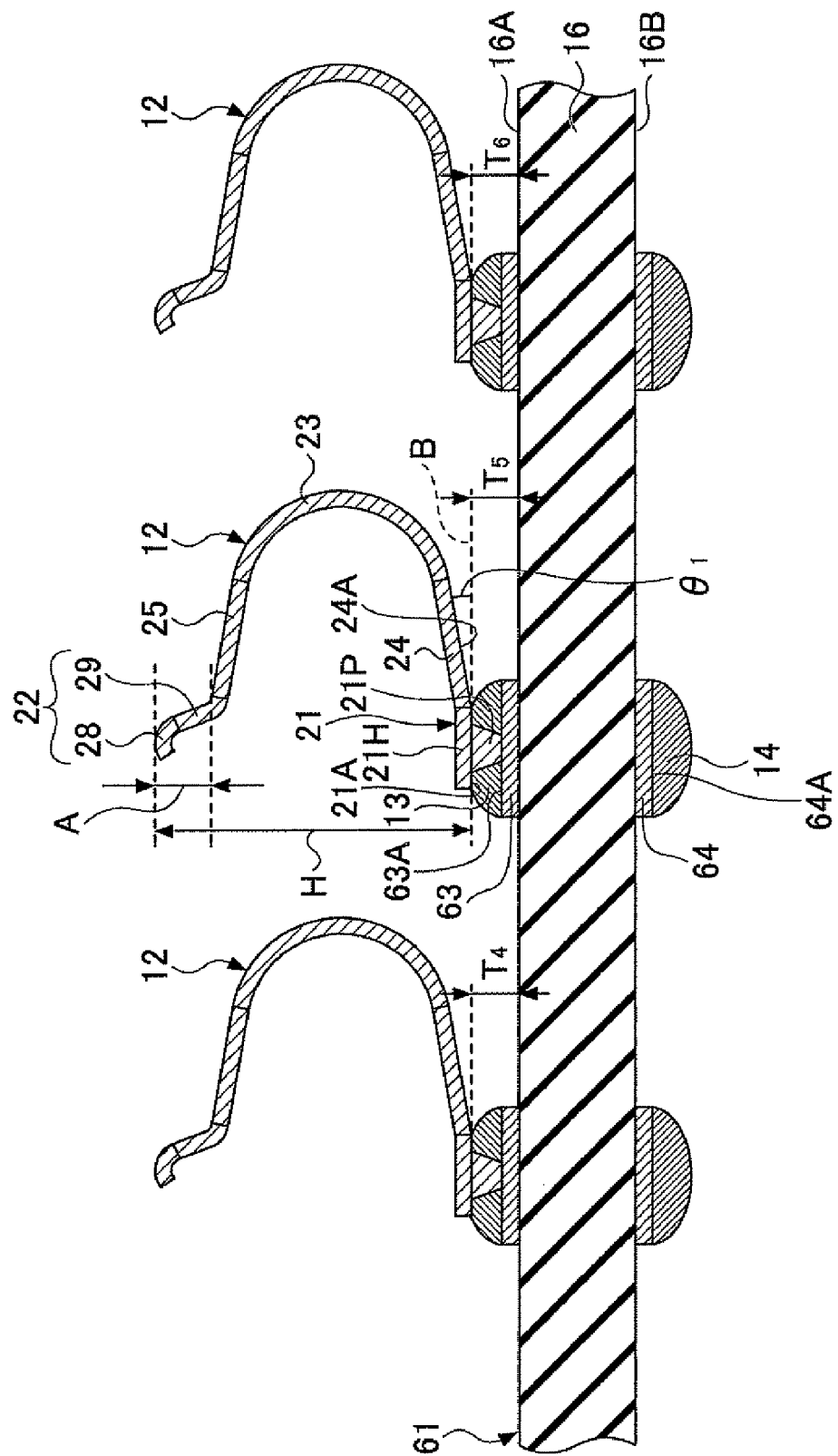
FIG. 9 is a cross-sectional view of a connection-terminals-equipped board according to a third embodiment of the present invention.
Figure 10:
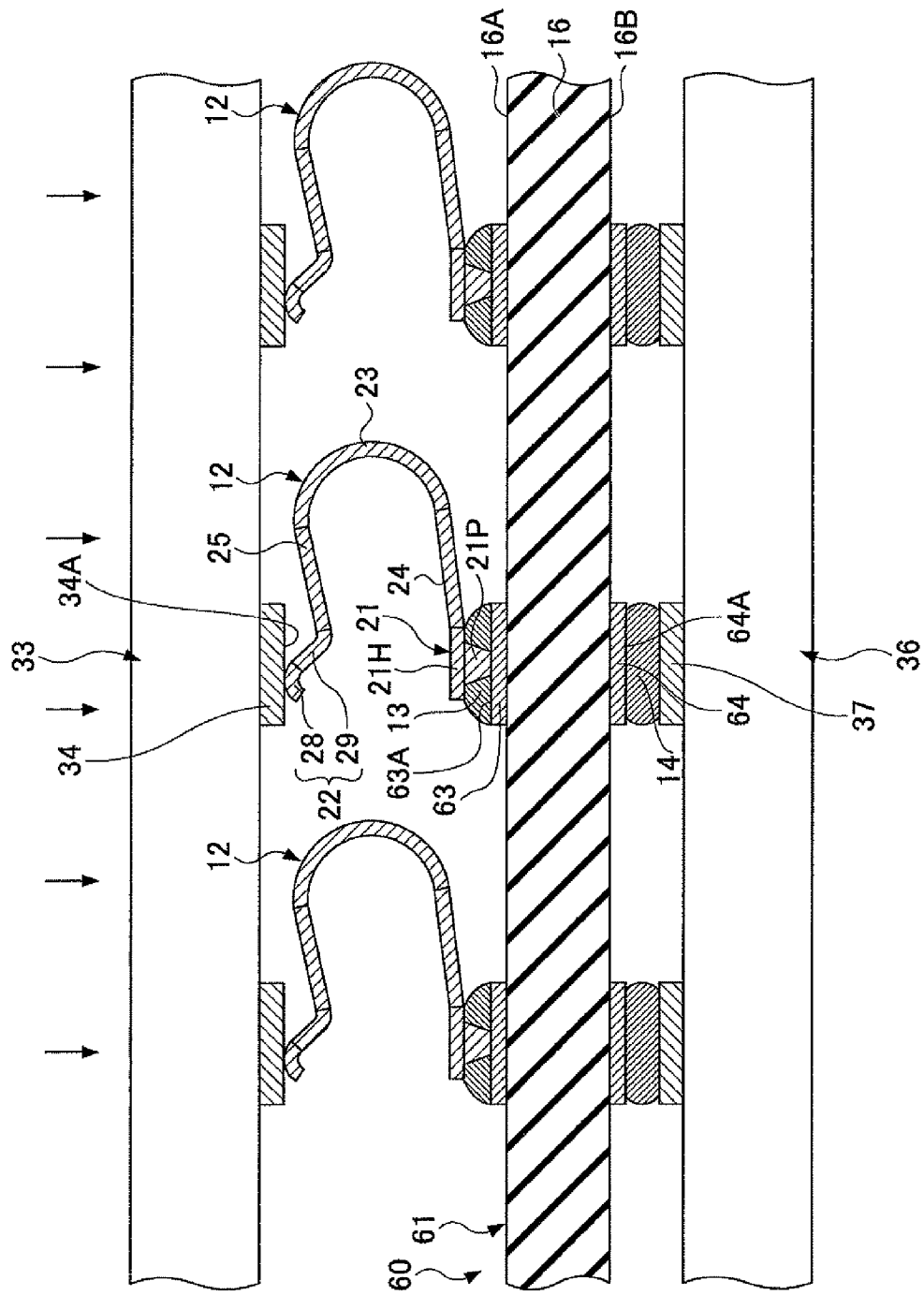
FIG. 10 is a cross-sectional view of the connection-terminals-equipped board, which is electrically connected to the object of connection and the mounting board, according to the third embodiment of the present invention.

FIG. 9 is a cross-sectional view of a connection-terminals-equipped board according to a third embodiment of the present invention. FIG. 10 is a cross-sectional view of the connection-terminals-equipped board, which is electrically connected to an object of connection and a mounting board, according to the third embodiment.

In FIG. 9, the same elements as those of the connection-terminals-equipped board 10 according to the first embodiment are referred to by the same reference numerals, and a description thereof may be omitted. Further, in FIG. 10, the same elements as those of the connection-terminals-equipped board of FIG. 9 are referred to by the same reference numerals, and a description thereof may be omitted.

Referring to FIG. 9 and FIG. 10, a connection-terminals-equipped board 60 according to the third embodiment has the same configuration as the connection-terminals-equipped board 10 according to the first embodiment except that the board 11 of the connection-terminals-equipped board 10 is replaced with a board 61.

The board 61 includes the board body 16, multiple pads 63, which are first conductors, and multiple pads 64, which are second conductors. The pads 63 are provided on the surface 16A of the board body 16. The pads 63 are electrically connected to the connection terminals 12 via the connection members 13 provided on connection surfaces 63A of the pads 63.

A wiring board such as a build-up board or a glass epoxy substrate where vias and interconnects are formed may be used as the board body 16 of the connection-terminals-equipped board 60.

The pads 64 are provided on the surface 16B of the board body 16. The pads 64 are electrically connected to the pads 63 via interconnection patterns (vias and interconnects) (not graphically illustrated) provided in the board body 16. The pads 64 are electrically connected to the corresponding pads 37 of the mounting board 36 via the external connection members 14 provided on connection surfaces 64A of the pads 64.

The connection-terminals-equipped board 60 configured as described above according to the third embodiment can produce the same effects as the connection-terminals-equipped board 10 according to the first embodiment.

Further, the connection-terminals-equipped board 60 according to the third embodiment can be manufactured by executing substantially the same process as that of the method of manufacturing the connection-terminals-equipped board 10 according to the first embodiment.

[d] Fourth Embodiment

Figure 11:
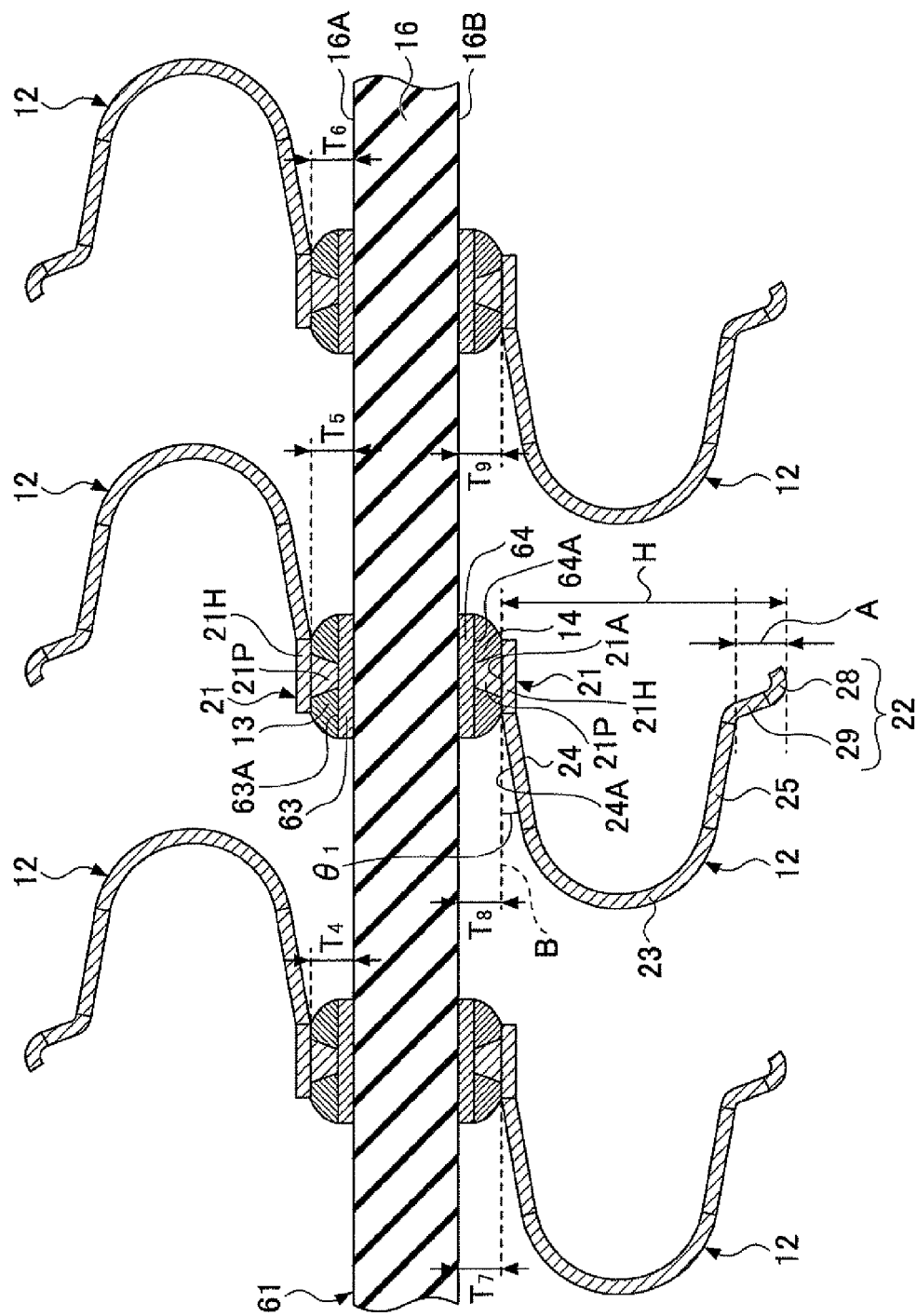
FIG. 11 is a cross-sectional view of a connection-terminals-equipped board according to a fourth embodiment of the present invention.
Figure 12:
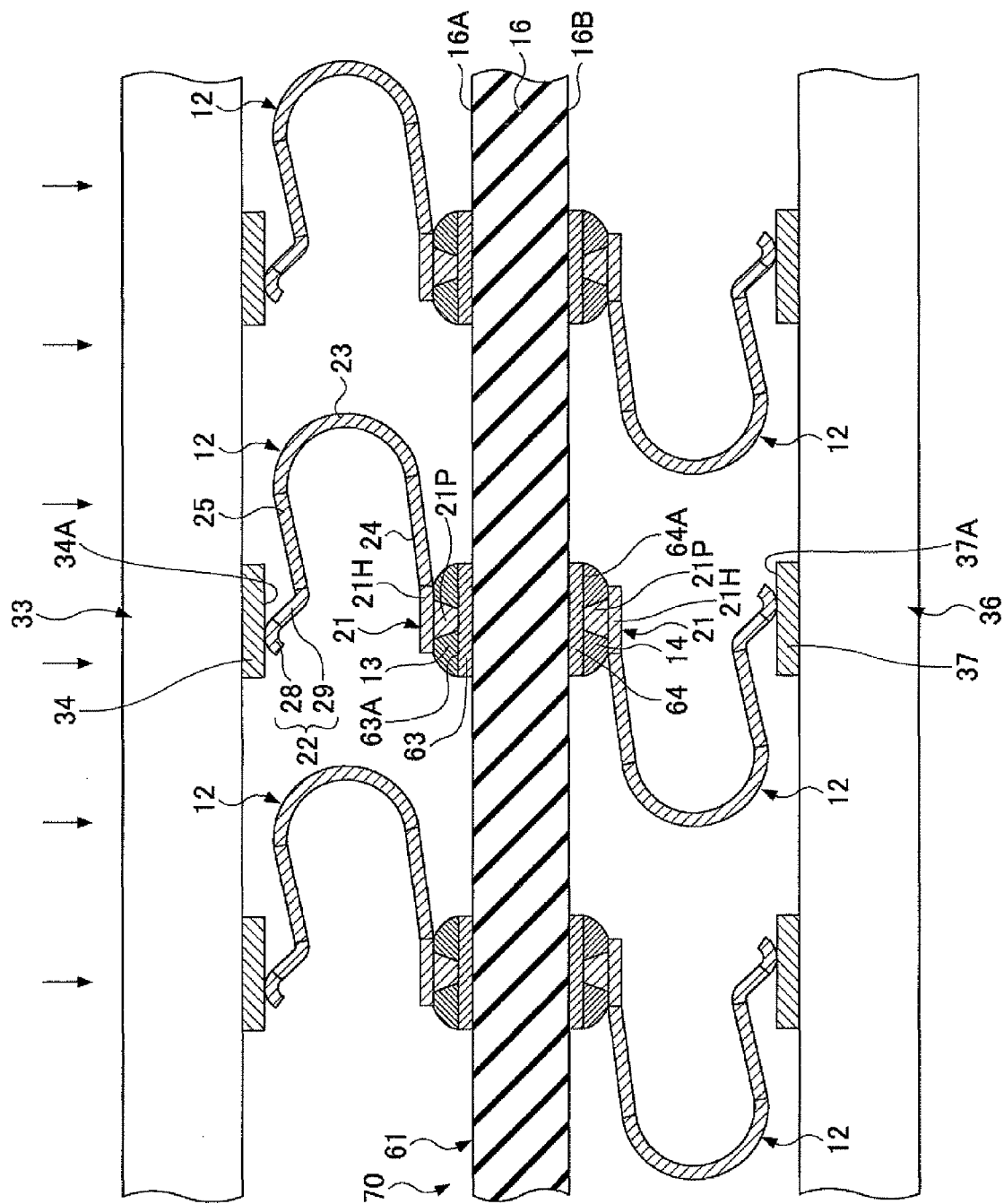
FIG. 12 is a cross-sectional view of the connection-terminals-equipped board, which is electrically connected to the object of connection and the mounting board, according to the fourth embodiment of the present invention.

FIG. 11 is a cross-sectional view of a connection-terminals-equipped board according to a fourth embodiment of the present invention. FIG. 12 is a cross-sectional view of the connection-terminals-equipped board, which is electrically connected to an object of connection and a mounting board, according to the fourth embodiment.

In FIG. 11, the same elements as those of the connection-terminals-equipped board 60 according to the third embodiment are referred to by the same reference numerals, and a description thereof may be omitted. Further, in FIG. 12, the same elements as those of the connection-terminals-equipped board of FIG. 11 are referred to by the same reference numerals, and a description thereof may be omitted.

Referring to FIG. 11 and FIG. 12, a connection-terminals-equipped board 70 according to the fourth embodiment has the same configuration as the connection-terminals-equipped board 60 according to the third embodiment except that the connection terminals 12 are provided also on the external connection members 14 of the connection-terminals-equipped board 60.

The connection terminals 12 provided on the external connection members 14 are positioned on the side of the surface 16B (second surface) of the board body 16, and are electrically connected to the corresponding pads 64 via the external connection members 14. The second connection parts 22 of the connection terminals 12 placed on the side of the surface 16B of the board body 16 are electrically connected to the mounting board 36 by contacting the surfaces 37A of the corresponding pads 37 without being fixed to the pads 37. Thereby, the connection-terminals-equipped board 70 is electrically connected to the mounting board 36 via the connection terminals 12 placed on the side of the surface 16B of the board body 16. (See FIG. 12.)

The connection-terminals-equipped board 70 configured as described above according to the fourth embodiment can produce the same effects as the connection-terminals-equipped board 10 according to the first embodiment.

Further, the connection-terminals-equipped board 70 according to the fourth embodiment can be manufactured by executing substantially the same process as that of the method of manufacturing the connection-terminals-equipped board 10 according to the first embodiment except for executing the processes of FIGS. 6C and 6D described in the first embodiment twice.

[e] Fifth Embodiment

Figure 13:
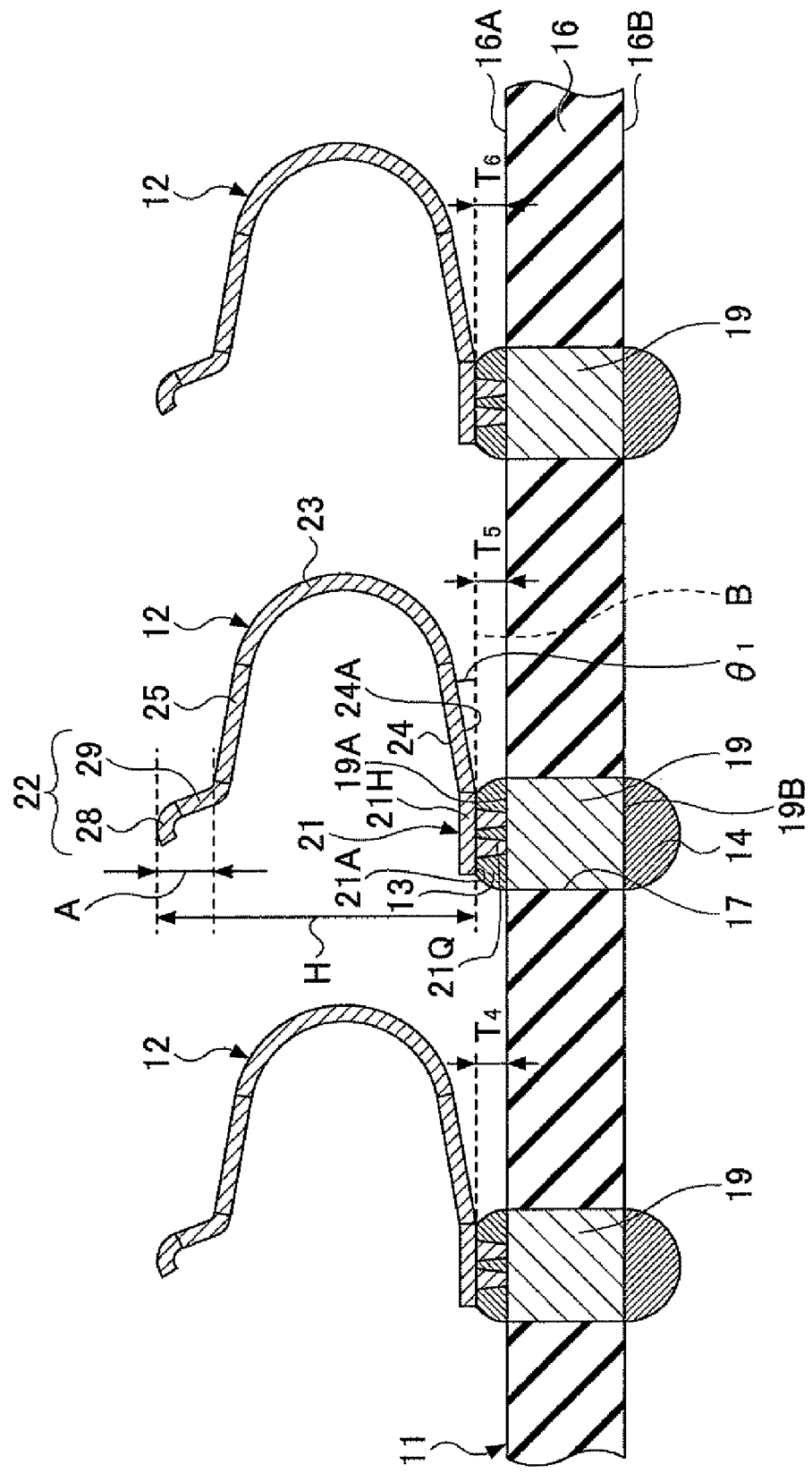
FIG. 13 is a cross-sectional view of a connection-terminals-equipped board according to a fifth embodiment of the present invention.
Figure 14:
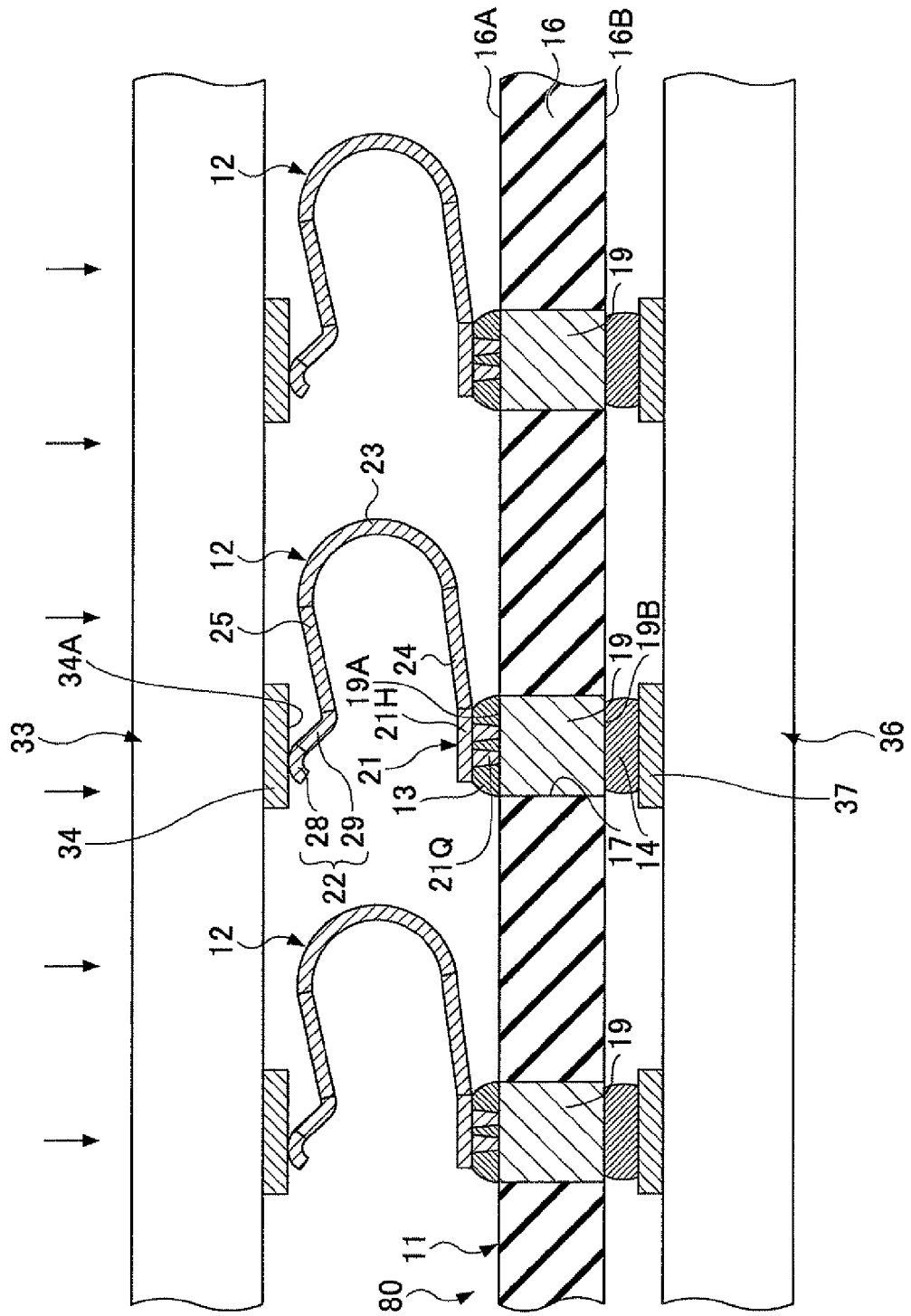
FIG. 14 is a cross-sectional view of the connection-terminals-equipped board, which is electrically connected to the object of connection and the mounting board, according to the fifth embodiment of the present invention.

FIG. 13 is a cross-sectional view of a connection-terminals-equipped board according to a fifth embodiment of the present invention. FIG. 14 is a cross-sectional view of the connection-terminals-equipped board, which is electrically connected to an object of connection and a mounting board, according to the fifth embodiment.

In FIG. 13, the same elements as those of the connection-terminals-equipped board 10 according to the first embodiment are referred to by the same reference numerals, and a description thereof may be omitted. Further, in FIG. 14, the same elements as those of the connection-terminals-equipped board of FIG. 13 are referred to by the same reference numerals, and a description thereof may be omitted.

Referring to FIG. 13 and FIG. 14, a connection-terminals-equipped board 80 according to the fifth embodiment has the same configuration as the connection-terminals-equipped board 10 according to the first embodiment except that the projection parts 21P of the connection-terminals-equipped board 10 are replaced with projection parts 21Q.

The projection parts 21Q are provided so that there are two or more of the projection parts 21Q on each of the surfaces 21A of the plate-shaped parts 21H, the surfaces 21A being on the side facing toward the board 11. The projection parts 21Q may be provided on each of the plate-shaped parts 21H either as a unitary structure with or as bodies separate from the plate-shaped part 21H so as to project toward the board body 16. The projection parts 21Q may have, for example, the shape of a frustum of a cone (or a truncated cone shape). The surfaces of the projection parts 21Q on the side of the surfaces 21A of the plate-shaped parts 21H may be, for example, 25 μm to 100 μm in diameter. The projection parts 21Q may be, for example, 50 μm to 100 μm in height. Thus, in each of the connection terminals 12, the surface 21A of the plate-shaped part 21H on the side facing toward the board 11 may be provided with two or more of the projection parts 21Q.

The connection-terminals-equipped board 80 configured as described above according to the fifth embodiment can produce the following effects in addition to the same effects as the connection-terminals-equipped board 10 according to the first embodiment. That is, with respect to each of the connection terminals 12, the surfaces of the projection parts 21Q come into contact with the connection member 13 in a larger area than the surface of the projection part 21P according to the first embodiment, thus making it possible to increase adhesion to the connection member 13. Further, since the surfaces of the projection parts 21Q come into contact with the connection member 13 in a larger area than the surface of the projection part 21P according to the first embodiment, the resistance can be reduced where the projection parts 21Q and the connection member 13 come into contact.

The connection-terminals-equipped board 80 according to the fifth embodiment can be manufactured by executing substantially the same process as that of the method of manufacturing the connection-terminals-equipped board 10 according to the first embodiment.

The fifth embodiment may be combined with one or more of the second through fourth embodiments.

[f] Sixth Embodiment

Figure 15:
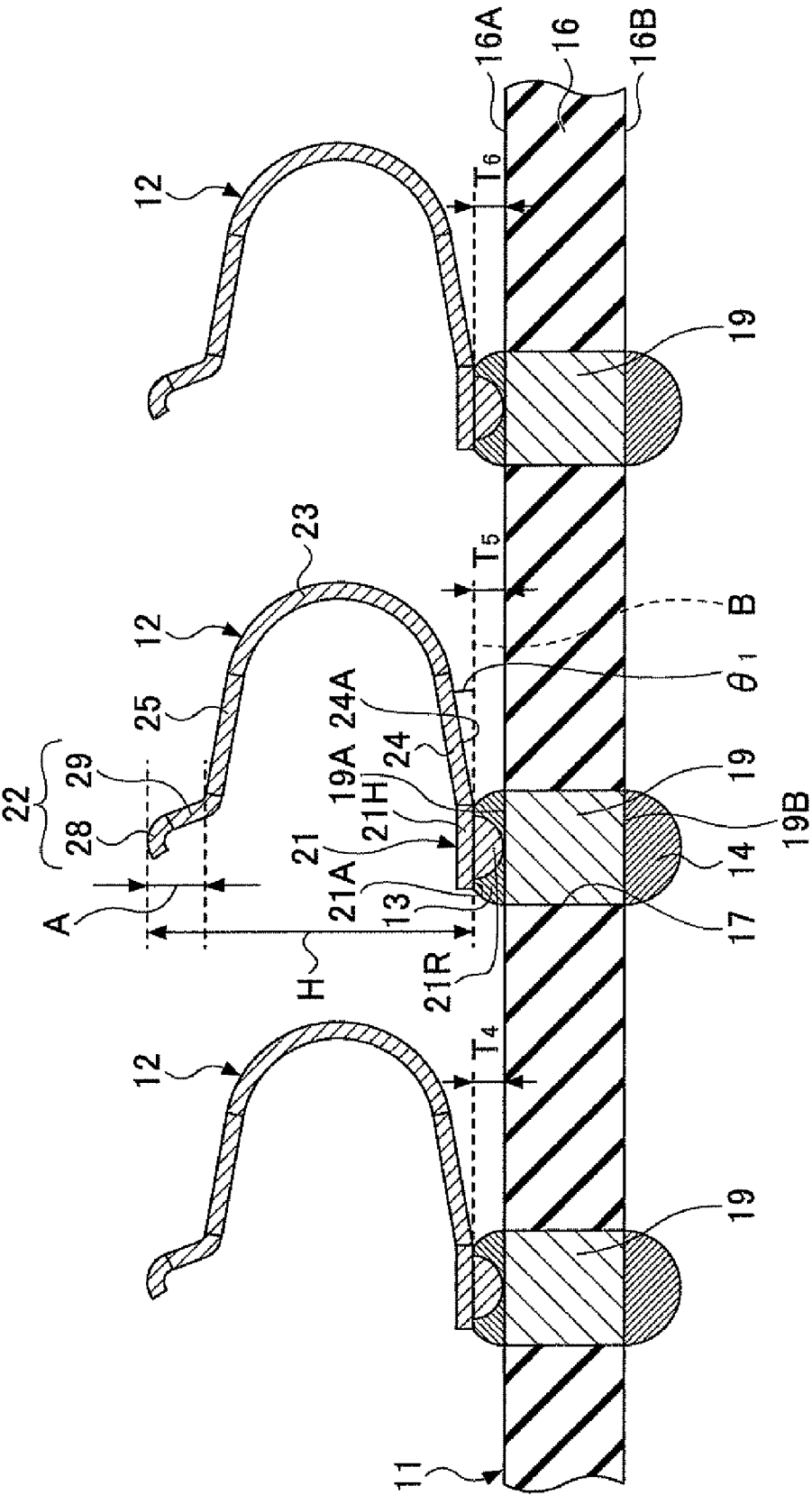
FIG. 15 is a cross-sectional view of a connection-terminals-equipped board according to a sixth embodiment of the present invention.
Figure 16:
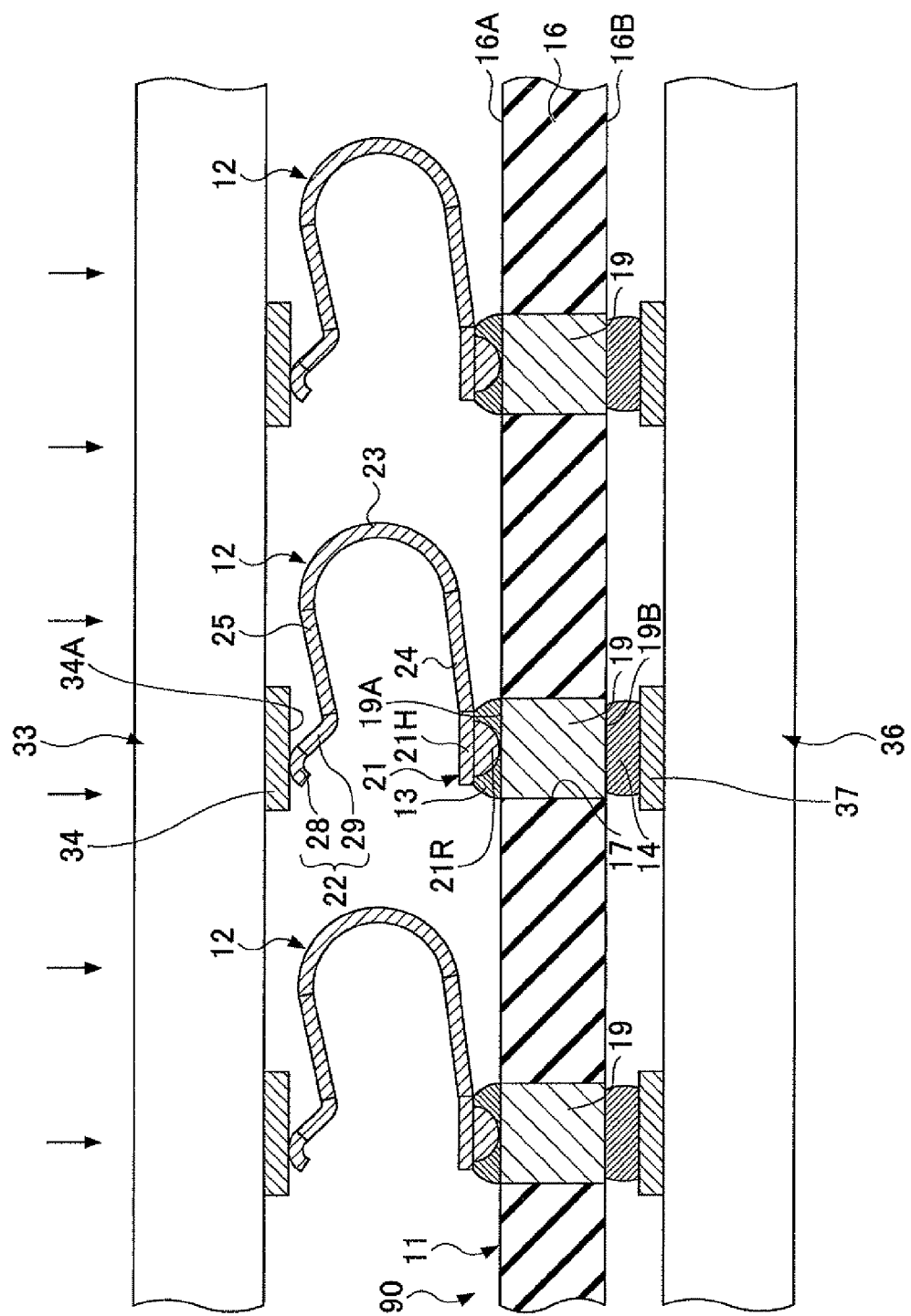
FIG. 16 is a cross-sectional view of the connection-terminals-equipped board, which is electrically connected to the object of connection and the mounting board, according to the sixth embodiment of the present invention.

FIG. 15 is a cross-sectional view of a connection-terminals-equipped board according to a sixth embodiment of the present invention. FIG. 16 is a cross-sectional view of the connection-terminals-equipped board, which is electrically connected to an object of connection and a mounting board, according to the sixth embodiment.

In FIG. 15, the same elements as those of the connection-terminals-equipped board 10 according to the first embodiment are referred to by the same reference numerals, and a description thereof may be omitted. Further, in FIG. 16, the same elements as those of the connection-terminals-equipped board of FIG. 15 are referred to by the same reference numerals, and a description thereof may be omitted.

Referring to FIG. 15 and FIG. 16, a connection-terminals-equipped board 90 according to the sixth embodiment has the same configuration as the connection-terminals-equipped board 10 according to the first embodiment except that the projection parts 21P of the connection-terminals-equipped board 10 are replaced with projection parts 21R.

In the individual connection terminals 12, the projection part 21R is provided on the surface 21A of the plate-shaped part 21H, the surface 21A being on the side facing toward the board 11. The projection part 21R may be provided on the plate-shaped part 21H either as a unitary structure with or as a body separate from the plate-shaped part 21H so as to project toward the board body 16. The projection part 21R has a hemispherical shape. The surface of the projection part 21R on the side of the surface 21A of the plate-shaped part 21H may be, for example, 50 μm to 200 μm in diameter. The projection part 21R may be, for example, 50 μm to 100 μm in height. Thus, like the projection parts 21R, projection parts may be hemispherical in shape.

The connection-terminals-equipped board 90 configured as described above according to the sixth embodiment can produce the following effects in addition to the same effects as the connection-terminals-equipped board 10 according to the first embodiment. That is, with respect to each of the connection terminals 12, the surface of the projection part 21R comes into contact with the corresponding connection member 13 in a larger area than that of the projection part 21P according to the first embodiment, thus making it possible to increase adhesion to the connection member 13. Further, since the surface of the projection part 21R comes into contact with the corresponding connection member 13 in a larger area than that of the projection part 21P according to the first embodiment, the resistance can be reduced where the projection part 21R and the connection member 13 come into contact.

However, in the case of attaching importance to the parallelism of the surfaces 21A of the plate-shaped parts 21H and the board 11 (the surface 16A of the board body 16), it is preferable to use the projection parts 21P whose end surfaces are flat. That is, it is preferable to select a shape of the projection part suitable for a purpose, that is, it is preferable to determine the shape of the projection part in accordance with a purpose such as whether to attach importance to adhesion and resistance or to parallelism.

The connection-terminals-equipped board 90 according to the sixth embodiment can be manufactured by executing substantially the same process as that of the method of manufacturing the connection-terminals-equipped board 10 according to the first embodiment. The sixth embodiment may be combined with one or more of the second through fifth embodiments.

[g] Seventh Embodiment

Figure 17:
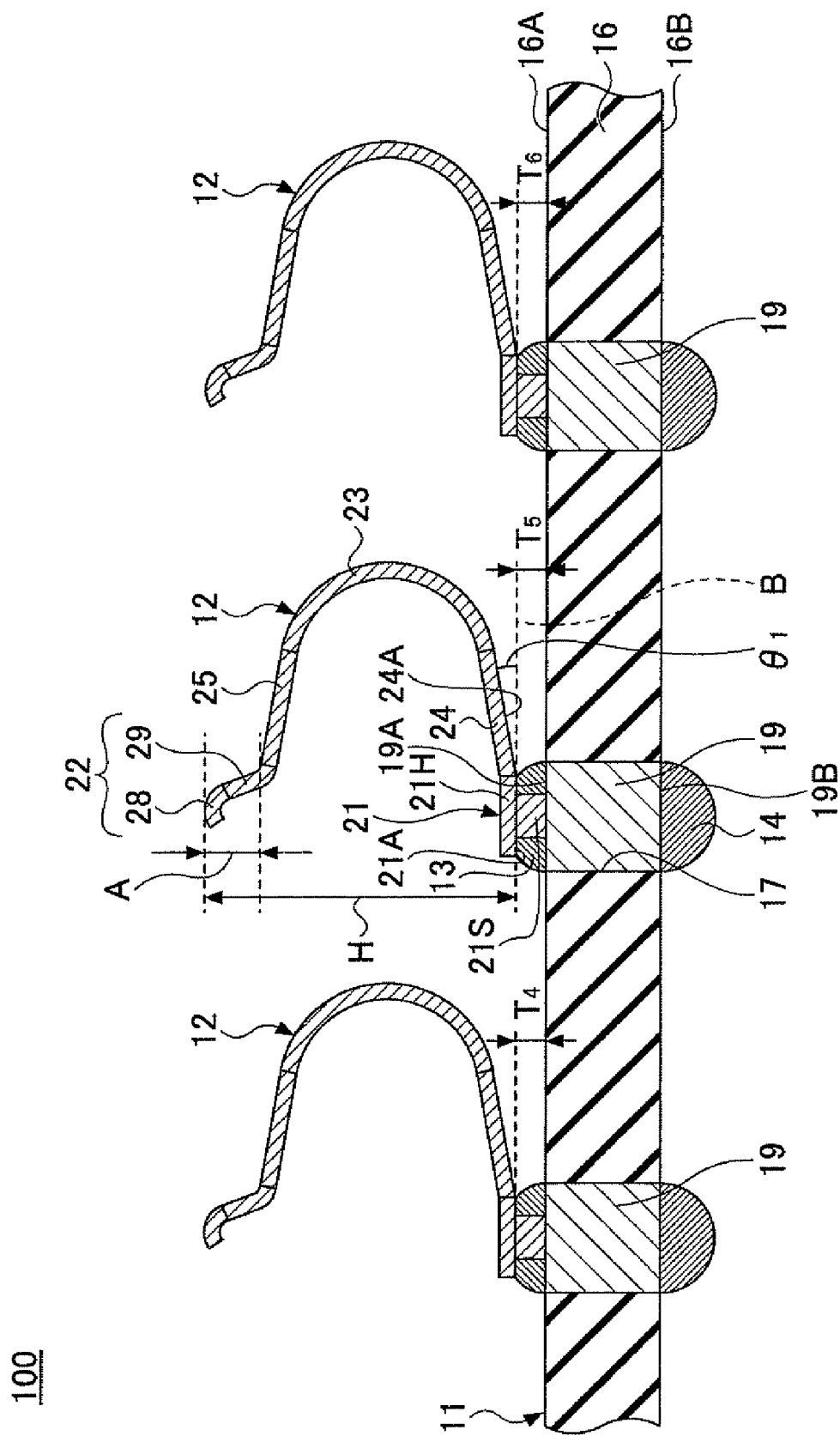
FIG. 17 is a cross-sectional view of a connection-terminals-equipped board according to a seventh embodiment of the present invention.
Figure 18:
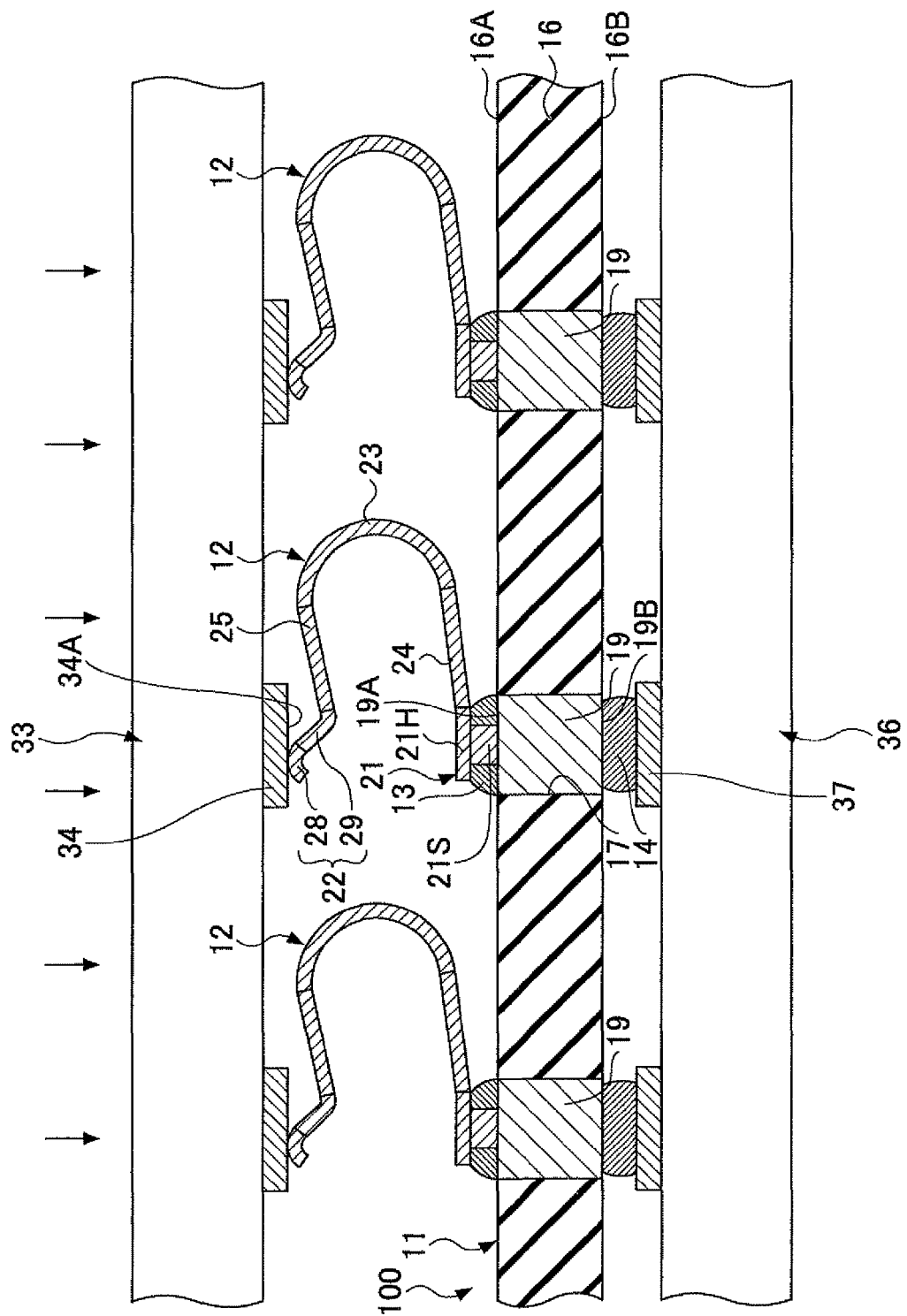
FIG. 18 is a cross-sectional view of the connection-terminals-equipped board, which is electrically connected to the object of connection and the mounting board, according to the seventh embodiment of the present invention.

FIG. 17 is a cross-sectional view of a connection-terminals-equipped board according to the seventh embodiment of the present invention. FIG. 18 is a cross-sectional view of the connection-terminals-equipped board, which is electrically connected to an object of connection and a mounting board, according to the seventh embodiment.

In FIG. 17, the same elements as those of the connection-terminals-equipped board 10 according to the first embodiment are referred to by the same reference numerals, and a description thereof may be omitted. Further, in FIG. 18, the same elements as those of the connection-terminals-equipped board of FIG. 17 are referred to by the same reference numerals, and a description thereof may be omitted.

Referring to FIG. 17 and FIG. 18, a connection-terminals-equipped board 100 according to the seventh embodiment has the same configuration as the connection-terminals-equipped board 10 according to the first embodiment except that the projection parts 21P of the connection-terminals-equipped board 10 are replaced with projection parts 21S.

In the individual connection terminals 12, the projection part 21S is provided on the surface 21A of the plate-shaped part 21H, the surface 21A being on the side facing toward the board 11. The projection part 21S may be provided on the plate-shaped part 21H either as a unitary structure with or as a body separate from the plate-shaped part 21H so as to project toward the board body 16. The projection part 21S has a cylindrical or elliptic-cylindrical shape. The projection part 21S may be, for example, 50 μm to 200 μm in diameter or transverse (longitudinal) diameter. The projection part 21S may be, for example, 50 μm to 100 μm in height. Thus, like the projection parts 21S, projection parts may be cylindrical or elliptic-cylindrical in shape.

The connection-terminals-equipped board 100 configured as described above according to the seventh embodiment can produce the same effects as the connection-terminals-equipped board 10 according to the first embodiment.

Further, the connection-terminals-equipped board 100 according to the seventh embodiment can be manufactured by executing substantially the same process as that of the method of manufacturing the connection-terminals-equipped board 10 according to the first embodiment. However, the projection part 21S may be formed using plating instead of the formation method using stamping as illustrated in the first embodiment. In this case, the projection part 21S may be formed as follows. That is, a resist film (for example, 100 μm in thickness) is formed on the surface 21A of the plate-shaped part 21H. Then, the resist film is exposed to light and developed so as to remove part of the resist film corresponding to a region where the projection part 21S is to be formed, thereby forming an opening. Then, a plating film of, for example, Cu is deposited and caused to grow on the surface 21A of the plate-shaped part 21H in the opening by a plating method such as electroplating. Then, the resist film is removed. Thereafter, surface treatment may be performed with Ni plating or Au plating by, for example, electroplating.

The seventh embodiment may be combined with one or more of the second through fifth embodiments.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present inventions have been described in detail, it should be understood that various changes, substitutions, and alterations could be made hereto without departing from the spirit and scope of the invention.

For example, the shape of a connection terminal to which the present invention may be applied is not limited to the shape of the connection terminals 12 illustrated in the first through seventh embodiments. For example, the present invention may be applied to a connection terminal that includes a doglegged part instead of curving like a C-letter shape. Further, the present invention may also be applied to a connection terminal that does not include a curved part. Examples of such a connection terminal include a connection terminal having a projection part provided on the surface 230C of the connection terminal 230 illustrated in FIG. 1.

The connection-terminals-equipped boards 10, 50, 60, 70, 80, 90, and 100 illustrated in the first through seventh embodiments may be used as, for example, connecting boards such as interposers or sockets that connect an electric component and the mounting board 36. For example, in the case of using them for connecting a semiconductor package to the mounting board 36, the semiconductor package is placed instead of the object of connection 33 illustrated in FIG. 5.

Further, the connection-terminals-equipped boards 10, 50, 60, 70, 80, 90, and 100 illustrated in the first through seventh embodiments may also be used as contact probes for conducting electrical tests on electric components, for example. In this case, the connection terminals 12 serve as the connection terminals of a probe.

FIG. 19 is a diagram illustrating an application of the present invention to a semiconductor package according to an eighth embodiment of the present invention.

As illustrated in FIG. 19, a semiconductor package 110 including the connection-terminals-equipped board 10 according to the first embodiment (which, in this case, is a connection-terminals-equipped board provided with bumps 115 in place of the external connection terminals 14) may be electrically connected to the pads 37 of the mounting board 36.

The semiconductor package 110 includes a semiconductor chip 111 having electrode pads 113; the connection-terminals-equipped board 10 (a connection-terminals-equipped board provided with the bumps 115 in place of the external connection terminals 14); the bumps 115, which are connected to the pads 113 and the second end faces 19B of the through electrodes (vias) 19; and underfill resin 114 filling in the gap between the semiconductor chip 111 and the connection-terminals-equipped board 10. The connection-terminals-equipped board 10 may be replaced with any of the connection-terminals-equipped boards 50, 60, 70, 80, 90, and 100 in this application.

The board body 16 illustrated in FIG. 19, which is formed of silicon, may be replaced with, for example, a wiring board such as a build-up board or a glass epoxy substrate where vias and interconnects are formed.

What is claimed is:
1. A board, comprising:
a board body;
a first conductor provided at a first surface of the board body; and
an electrically conductive connection terminal having a spring property, the connection terminal being a metal plate bent in a direction of thickness thereof,
the connection terminal including
a plate-shaped first end part having a flat surface facing toward the first conductor;
a second end part to be connected to a first object of connection to be placed opposite the first surface of the board body; and
a projection part provided on the flat surface of the first end part so as to project toward the first conductor,
wherein the projection part has an end portion thereof in contact with the first conductor with a connection member provided between the flat surface of the first end part and the first conductor and fixing the first end part to the first conductor.

2. The board as claimed in claim 1, further comprising:
a second conductor provided at a second surface of the board body, the second surface facing away from the first surface of the board body; and
an additional electrically conductive connection terminal having a spring property,
the additional connection terminal including
a first end part fixed to the second conductor;
a second end part to be connected to a second object of connection to be placed opposite the second surface of the board body; and
a projection part provided on the first end part so as to project into the second conductor.

3. The board as claimed in claim 2, further comprising:
a through electrode provided through the board body from the first surface thereof to the second surface thereof,
wherein the first conductor comprises a first end of the through electrode exposed at the first surface of the board body, and
the second conductor comprises a second end of the through electrode exposed at the second surface of the board body.

4. The board as claimed in claim 1, wherein the projection part of the connection terminal comprises a plurality of projections.

5. The board as claimed in claim 1, wherein the projection part of the connection terminal has a truncated cone shape.

6. The board as claimed in claim 1, wherein the projection part of the connection terminal has a hemispherical shape.

7. The board as claimed in claim 1, wherein the projection part of the connection terminal has a cylindrical shape.

8. The board as claimed in claim 1, wherein the connection terminal further includes:
a curved spring part;
a first support part connecting the spring part and the first end part; and
a second support part connecting the spring part and the second end part,
wherein the second end part is positioned above the first end part to face toward the first end part.

9. The board as claimed in claim 8, wherein the second end part includes:
a projecting part projecting in a direction toward the first object of connection from the second support part; and
a contact part formed at an end part of the projecting part, the contact part being configured to come into contact with the first object of connection.

10. The board as claimed in claim 1, wherein the connection terminal has a plating film formed on a surface of the metal plate.

11. The board as claimed in claim 1, wherein the metal plate comprises a copper-based alloy.

12. The board as claimed in claim 11, wherein the copper-based is phosphor bronze or beryllium copper.

13. The board as claimed in claim 1, wherein the projection part is formed unitarily with the metal plate.

14. The board as claimed in claim 1, wherein the projection part is formed of a plating metal deposited on the flat surface of the first end part.

15. The board as claimed in claim 1, wherein the connection member comprises solder or electrically conductive paste.

16. The board as claimed in claim 1, wherein the board is a socket of an electronic component, an interposer of the electronic component, or a contact probe for testing the electronic component.

17. A semiconductor package, comprising:
the board as set forth in claim 1; and
a semiconductor chip connected to the board.

* * * * *